United States Patent
Masui et al.

(10) Patent No.: US 10,255,865 B2
(45) Date of Patent: Apr. 9, 2019

(54) DATA PROCESSING DEVICE CONNECTED WITH DISPLAY DEVICE AND CONTROL METHOD OF DISPLAY DEVICE

(71) Applicant: Sharp Kabushiki Kaisha, Sakai, Osaka (JP)

(72) Inventors: Teruhisa Masui, Sakai (JP); Yousuke Nakamura, Sakai (JP); Noriyuki Tanaka, Sakai (JP); Tatsuhiko Suyama, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 125 days.

(21) Appl. No.: 15/532,703

(22) PCT Filed: Nov. 27, 2015

(86) PCT No.: PCT/JP2015/083351
§ 371 (c)(1),
(2) Date: Jun. 2, 2017

(87) PCT Pub. No.: WO2016/088666
PCT Pub. Date: Jun. 9, 2016

(65) Prior Publication Data
US 2018/0012552 A1  Jan. 11, 2018

(30) Foreign Application Priority Data
Dec. 5, 2014  (JP) .................................. 2014-247461

(51) Int. Cl.
*G02F 1/133* (2006.01)
*G09G 3/36* (2006.01)
(Continued)

(52) U.S. Cl.
CPC ........... *G09G 3/3611* (2013.01); *G02F 1/133* (2013.01); *G09G 3/2096* (2013.01);
(Continued)

(58) Field of Classification Search
CPC ... G02F 1/133; G02F 2360/12; G09G 3/3618; H01L 27/1225
(Continued)

(56) References Cited

U.S. PATENT DOCUMENTS 8,669,556 B2 * 3/2014 Yamazaki ........... H01L 29/7869
257/57
9,412,317 B2 * 8/2016 Tanaka ................. G09G 3/3648
(Continued)

FOREIGN PATENT DOCUMENTS

| JP | 2012134475 A | 7/2012 |
|----|--------------|--------|
| WO | 2013008668 A1 | 1/2013 |
| WO | 2013140980 A1 | 9/2013 |

*Primary Examiner* — Thomas J Lett
(74) *Attorney, Agent, or Firm* — ScienBiziP, P.C.

(57) ABSTRACT

The present invention provides a data processing device connected with an intermission driving. The data processing device achieves a satisfactory power saving while ensuring a high level of display quality of the display device. Upon detection of non-data update in a frame buffer, the host calculates a next refreshing timing based on driving information obtained from a liquid crystal display device (LCD), sets a timer for a timeout after a length of time representing the calculated result, and then the host and the LCD shift to Intermission State 1. Thereafter, when the timer times out to bring the host back to Normal State and a data update at the frame buffer is detected, data for refreshing an display image in the LCD is transferred from the host to the LCD. If the amount of time representing the calculated result is longer than a predetermined baseline, a shift is made to Intermission State 2 which provides greater power saving than Intermission State 1.

17 Claims, 17 Drawing Sheets

(51) Int. Cl.
  *G09G 3/20* (2006.01)
  *H01L 27/12* (2006.01)
  *G09G 5/395* (2006.01)

(52) U.S. Cl.
  CPC .......... *G09G 3/3618* (2013.01); *G09G 5/395* (2013.01); *H01L 27/1225* (2013.01); *G09G 3/3648* (2013.01); *G09G 2330/022* (2013.01); *G09G 2330/027* (2013.01); *G09G 2360/12* (2013.01)

(58) Field of Classification Search
  USPC ....................................................... 345/545
  See application file for complete search history.

(56) References Cited

U.S. PATENT DOCUMENTS

| | | | |
|---|---|---|---|
| 9,633,617 B2 * | 4/2017 | Nakata | ................ G09G 3/3648 |
| 2012/0138922 A1 | 6/2012 | Yamazaki et al. | |
| 2014/0125569 A1 | 5/2014 | Nakata et al. | |
| 2015/0009224 A1 | 1/2015 | Tanaka et al. | |
| 2016/0196781 A1 * | 7/2016 | Tanaka | ................ G09G 3/3648 |
| | | | 345/691 |

* cited by examiner

DATA PROCESSING DEVICE CONNECTED WITH DISPLAY DEVICE AND CONTROL METHOD OF DISPLAY DEVICE

TECHNICAL FIELD

The present invention relates to data processing devices connected with display devices which perform so called intermission driving, and to methods for controlling these display devices in these data processing devices.

BACKGROUND ART

Power saving in liquid crystal display devices and other display devices is an ongoing challenge. Toward this end, Patent Document 1, for example, discloses a display device driving method in which a refreshing period during which a display image is refreshed by scanning gate lines that serve as scanning signal lines of the liquid crystal display device is followed by a non-refreshing period during which refreshing is stopped by bringing all of the gate lines into a non-scanning state. In this intermission period, it is possible not to supply signals such as control signals to, e.g., a gate driver which serves as a scanning signal line drive circuit and/or a source driver which serves as a data signal line drive circuit. This makes it possible to stop operation of the gate driver and/or the source driver, and therefore to reduce power consumption. The driving method in which a refreshing period is followed by a non-refreshing period (intermission period) as exemplified in Patent Document 1 is called "intermission driving" for example. The intermission driving is also called "low-frequency driving" or "intermittent driving". Intermission driving as described above is suitable for displaying a still image. Inventions related to intermission driving are disclosed in Patent Document 2 and other publications as well as Patent Document 1.

In a display device in which intermission driving as described above is performed, display image is not refreshed for every frame period when there is no change in the image which is to be displayed. However, display image must be refreshed for every predetermined period which is longer than one frame period. If the display device is provided with a frame buffer which holds display image data to be used for the refreshing, it is possible to carry out the refreshing within the display device by internal operation. In many cases, however, the frame buffer is not provided within the display device for the sake of cost reduction, and in such a case, a frame buffer is provided in a main body of an electronic appliance that has the display device as a component. In this case, there are two conventional methods for transferring the image data to the display device for the refreshing purpose: In the following description, the main body to which the display device is connected in the electronic appliance (portable terminal for example) will be called "host", and it is assumed that the display device and a data processing device which serves as the host are connected with each other and capable of sending/receiving data therebetween.

In the first method, display image refreshing timing management is made within the display device: As shown in FIG. 17, in the electronic appliance which includes the display device, a signal for requesting transfer of image data for the purpose of refreshing (hereinafter called "REQUEST signal") is sent from the display device to the host. Upon receiving the REQUEST signal, the host reads out the image data which is stored in the frame buffer provided in the host, and sends the data to the display device. Upon receiving this image data, the display device drives its display section based on the data, thereby refreshing the display image.

In the second method, a frame buffer for storing image data to be displayed in the display device is provided on the host side, and the host determines whether the display device is in its intermission state or normal state, based on whether or not the image data in the frame buffer has been updated. If a result of determination indicates that the display device is in the intermission state, the host sends the image data stored in the frame buffer to the display device periodically as shown in FIG. 18 at a predetermined time interval while the display device is in its intermission state.

PRIOR ART DOCUMENTS

Patent Documents

Patent Document 1: WO/2013/008668
Patent Document 2: WO/2013/140980

SUMMARY OF THE INVENTION

Problems to be Solved by the Invention

A problem with the first method is that the host has to monitor for a REQUEST signal which is sent from the display device. For this reason, the host cannot shift to an intermission state (sleep state) even when the display device is in an intermission state. As a result, intermission driving performed at the display device does not decrease power consumption in the host, and therefore overall power saving as the electronic appliance is small.

In the second method, the host transfers refreshing image data independently from the operating state of the display device, and this means that refreshing is performed more frequently than needed in the display device. As a result, overall power saving as the electronic appliance is small even if the display device performs intermission driving. Also, in this case, since refreshing image data is transferred without considering the operating state of the display device, there can be flickering in the displayed image depending on refreshing timing.

It is therefore an object of the present invention to provide a data processing device which is connected with an intermission driving display device and has a frame buffer, and is capable of achieving a satisfactory power saving by means of intermission driving while ensuring a high level of display quality of the display device.

Solutions to the Problem

A first aspect of the present invention provides a data processing device connected data-exchangeably with a display device which drives a display section in such a manner that a refreshing period during which an image displayed in the display section is refreshed and a non-refreshing period during which an image displayed in the display section is not refreshed are alternated with each other, the data processing device including:

a frame buffer configured to store image data representing an image to be displayed in the display section;

an update detection section configured to detect an update of image data in the frame buffer;

a data transfer controller configured to: transfer image data stored in the frame buffer to the display device when the update detection section detects an update of image data in the frame buffer; determine a next refreshing timing of the display image in the display section based on refreshing-related information obtained from the display device as information regarding refreshing timing determination of the display image in the display section and assume an intermission state for an intermission period corresponding to the next refreshing timing when the update detection section detects a non-update of the image data in the frame buffer for a predetermined period; and transfer image data stored in the frame buffer to the display device upon returning from the intermission state to a normal state.

A second aspect of the present invention provides the data processing device according to the first aspect of the present invention, wherein the data transfer controller returns to the normal state and transfers image data stored in the frame buffer to the display device when the update detection section detects an update of image data in the frame buffer while the data transfer controller is in the intermission state.

A third aspect of the present invention provides the data processing device according to the first or the second aspect of the present invention, wherein the data transfer controller obtains the refreshing-related information from the display device and determines the next refreshing timing based on the obtained refreshing-related information when the update detection section detects a non-update of image data in the frame buffer for the predetermined period.

A fourth aspect of the present invention provides the data processing device according to the first aspect of the present invention, wherein the intermission state includes a first intermission state and a second intermission state in which power consumption is smaller than in the first intermission state;

when the update detection section detects a non-update of image data in the frame buffer for the predetermined period, the data transfer controller transfers to the display device an instruction for stopping operation of a circuit which is within the display device but functionally replaceable by the data processing device and thereafter shifts from the normal state to the second intermission state, if the intermission period is longer than a predetermined reference period, but shifts from the normal state to the first intermission state without transferring the instruction to the display device if the intermission period is not longer than the reference period, and transfers to the display device information obtained by operation equivalent to operation to be made by the replaceable circuit and an instruction for resuming operation of the replaceable circuit when returning from the second intermission state to the normal state;

the data transfer controller returns to the normal state and transfers image data stored in the frame buffer to the display device when the update detection section detects an update of image data in the frame buffer while the data transfer controller is in the first intermission state.

A fifth aspect of the present invention provides the data processing device according to the fourth aspect of the present invention, wherein the data transfer controller transfers to the display device an instruction for turning off power supply which is adapted to power the circuit in the display device but unnecessary in the second intermission state and then shifts to the second intermission state, if the intermission period is longer than the reference period when the update detection section detects a non-update of image data in the frame buffer for the predetermined period and.

A sixth aspect of the present invention provides the data processing device according to the first or the second aspect of the present invention, wherein the data transfer controller includes:

a first interface circuit configured to transfer image data stored in the frame buffer to the display device, and a second interface circuit configured to obtain the refreshing-related information from the display device when the update detection section detects a non-update of image data in the frame buffer for the predetermined period, wherein the second interface circuit is provided as a serial interface having a slower data transfer speed than the first interface circuit.

A seventh aspect of the present invention provides the data processing device according to the first or the second aspect of the present invention, wherein the data transfer controller obtains the refreshing-related information from the display device upon power application to the display device.

A eighth aspect of the present invention provides the data processing device according to the seventh aspect of the present invention, wherein the data transfer controller determines the next refreshing timing from a non-refreshing count which is obtained by counting frames in the non-refreshing period based on the refreshing-related information.

A ninth aspect of the present invention provides the data processing device according to the first or the second aspect of the present invention, wherein the data processing device includes:

a processor, and a memory configured to store a program of an operating system which is capable of managing processes running on the processor, the programs being stored as an OS program, wherein the OS program includes device a driver program for controlling the display device, the update detection section is implemented as part of the device driver by the processor executing the OS program, the data transfer controller includes:

an interface circuit configured to exchanges data with the display device and an interface controller that is implemented as a system process to control the display device via control of the interface circuit, by the processor executing the OS program;

the interface controller stops the interface circuit and then assumes a sleep state when the data transfer controller shifts to the intermission state, and returns from the sleep state to an active state and causes the interface circuit to transfer image data which is stored in the frame buffer to the display device when the data transfer controller returns from the intermission state to the normal state.

Other aspects of the present invention are clear from the above description of the first through the ninth aspects of the present invention and from description of each embodiment to be made herein later, and therefore will not be stated here.

Advantages of the Invention

According to the first aspect of the present invention, in a data processing device functioning as a host to which an intermission driving display device is connected, when it is detected that image data in a frame buffer is not updated for a predetermined period, a next refreshing timing of the display image in a display section is determined based on refreshing-related information obtained from the display device; and a data transfer controller assumes an intermission state for an intermission period corresponding to the next refreshing timing. Upon returning from the intermission state to a normal state, image data stored in the frame buffer is transferred to the display device. Therefore, when an image which is to be displayed is not changed (when a still image is displayed), there is no need for the host to monitor for the REQUEST signal (signal requesting a transfer of image data for refreshing) from the display device (LCD (Liquid Crystal Display)), unlike in the convention (FIG. 17). In the present invention, the next refreshing timing is determined based on refreshing-related information (e.g., a frame count in the non-refreshing period, and a value indicating polarity imbalance of voltages applied to the liquid crystal in cases where an LCD is employed) which is obtained from the display device as information regarding the determination of the refreshing timing of display image in the display section. Therefore, it is possible to perform display image refreshing at an appropriate timing, taking characteristics of the display device and its driving state into account. Hence, it is possible to decrease power consumption not only in the display device but also in the data processing device which serves as the host, while ensuring high display quality of the intermission driving display device in such a configuration that the frame buffer is provided on the host side. Also, according to the first aspect of the present invention, determination as to whether or not an image to be displayed is changed or not is made based on whether or not data is updated in the frame buffer which is provided in the data processing device. This also helps decrease power consumption in the display device.

According to the second aspect of the present invention, when an update of image data in the frame buffer is detected while the data transfer controller is in the intermission state, the data transfer controller returns to the normal state; image data stored in the frame buffer is transferred to the display device, and the display device refreshes an image displayed therein, based on the image data. Therefore, even in cases where an image to be displayed is changed during the above-described intermission state, the changed image is quickly displayed in the display device.

According to the third aspect of the present invention, when it is detected that image data in the frame buffer is not updated for a predetermined period, refreshing-related information is obtained from the display device, and the next refreshing timing is determined based on the obtained refreshing-related information. Since refreshing-related information, which is used to determine the next refreshing timing, is obtained from the display device each time it is detected that an image to be displayed is not a changed image, it is possible to perform refreshing of a display image at a more appropriate timing suitable to a driving state of the display device. As a result, it is possible to greatly decrease power consumption in the data processing device serving as the host even in comparison with the conventional example (FIG. 18) in which data for refreshing is transferred from the host to the display device at a predetermined time interval if there is no change in an image to be displayed.

According to the fourth aspect of the present invention, when it is detected that image data in the frame buffer is not updated for a predetermined period, the next refreshing timing, which is determined based on the above-described refreshing-related information, corresponds to a length of the intermission period; if the non-update period is shorter than a predetermined reference period, the data transfer controller shifts to the first intermission state, whereas if the non-update period is longer than the predetermined reference period, the data transfer controller transfers to the display device instructions for stopping operations of those circuits within the display device which are functionally replaceable by the data processing device, and thereafter shifts to the second intermission state. When the data transfer controller returns from the second intermission state to the normal state, information obtained by operations which are equivalent to the operations made by the replaceable circuits, and instructions for resuming operations of the replaceable circuits are transferred to the display device. Also, when an update of image data in the frame buffer is detected while the data transfer controller is in the first intermission state, the data transfer controller returns to the normal state, and image data stored in the frame buffer is transferred to the display device. Therefore, in the first intermission state in which an intermission period is relatively short, a quick return to the normal state is performed so that an updated image will be displayed quickly if there is an update made in the image to be displayed, whereas in the second intermission state in which an intermission period is relatively long with an assumption that there will be a lower probability for bringing the sleeping data transfer controller back to the normal state quickly, those circuits within the display device which are functionally replaceable by components within the data processing device are stopped, whereby power consumption is decreased more substantially than in the first intermission state. This offers a greater power saving advantage for those display devices which are capable of extending their refreshing interval when display image is not updated.

According to the fifth aspect of the present invention, if the above-described intermission period is longer than a predetermined reference period when it is detected that image data in the frame buffer is not updated for a predetermined period, an instruction is transferred to the display device for turning off power supply which is adapted to power the circuit in the display device but unnecessary in the second intermission state, and then the data transfer controller shifts to the second intermission state. The arrangement ensures greater power saving in the display device in the second intermission state than in the first intermission state.

According to the sixth aspect of the present invention, data transfer controller is provided with, in addition to the first interface circuit which is for transferring image data from the frame buffer to the display device, the second interface circuit which is provided as a serial interface having a slower data transfer rate than the first interface, for data exchange with the display device. The second interface circuit is used for obtaining refreshing-related information from the display device when it is detected that image data in the frame buffer is not updated for a predetermined period. The arrangement decreases power consumption for data transfer between the data processing device and the display device through selective use of the first interface circuit and the second interface circuit as described, depending on the amount of data transfer.

According to the seventh aspect of the present invention, when it is detected that image data in the frame buffer is not updated for a predetermined period, the next refreshing timing is determined based on refreshing-related information obtained from the display device when power is turned on to the display device. In this arrangement, after the refreshing-related information is obtained upon the above-mentioned power application, information exchange with the display device regarding the refreshing timing is not performed, and this makes refreshing control of the display device simpler while offering the same power saving advantages as offered by the above-described first aspect.

According to the eighth aspect of the present invention, a non-refreshing count is obtained by counting the number of frames in the non-refreshing period based on the refreshing-related information which is obtained from the display device when the power is turned on to the display device, and the next refreshing timing is determined based on this non-refreshing count. This makes it possible to determine the next refreshing timing more appropriately without exchanging information regarding refreshing timing with the display device, and to ensure high image display quality in an intermission driving display device.

According to the ninth aspect of the present invention, main functions of the data transfer controller and functions of the update detection section are implemented by means of software by a device driver which controls the display device via control of interface circuits for exchanging data with the display device under an operating system capable of managing processes that are running on a processor in the data processing device. The arrangement offers the same advantages as offered by the above-described first aspects.

Advantages provided by other aspects of the present invention will be clear from the first through the ninth aspects of the present invention and from description of the embodiments to be given below, and therefore will not be stated here.

DESCRIPTION OF EMBODIMENTS

Hereinafter, embodiments of the present invention will be described with reference to the attached drawings. Hereinafter, the term one frame period means a period for refreshing one screen (redrawing an displayed image), and the length of "one frame period " is assumed as long as a commonly utilized length of one frame period (16.67 ms) used in display devices of a refreshing rate of 60 Hz. However, the present invention is not limited to this.

<1First Embodiment>
<1.1 Overall Configuration and Operation Outline>

Figure 1:
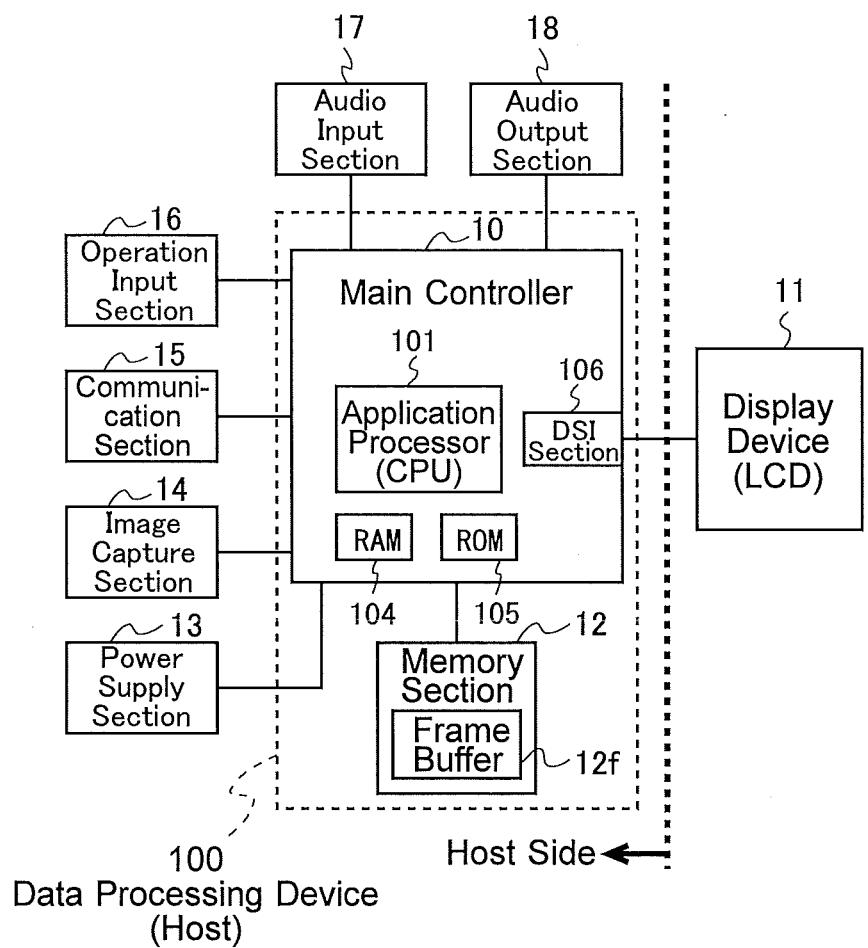
FIG. 1 is a block diagram which shows a configuration of a portable terminal as an electronic appliance incorporating a data processing device according to a first embodiment of the present invention.

FIG. 1 is a block diagram which shows a configuration of a portable terminal as an electronic appliance which makes use of a data processing device according to a first embodiment of the present invention. This portable terminal is configured, specifically, as a smartphone, tablet-type terminal, mobile telephone, PDA (Personal Digital Assistance), lap-top type personal computer or portable game console.

As shown in FIG. 1, the portable terminal includes a main controller 10, a display device 11, a memory section 12, a power supply section 13, an image capture section 14, a communication section 15, an operation input section 16, an audio input section 17, and an audio output section 18. The present invention unique in those characteristics which are related to operation of the display device 11 and from this point of view, description hereinafter will use a term data processing device 100 or a host 100 as a component including the main controller 10 which the display device 11 is connected with, and the memory section 12; and in the following description, the portable terminal representing an electronic appliance will be viewed as divided into a host side and a display device side.

The main controller 10 performs procedures and controls necessary for implementing various functions incorporated in the portable terminal, and includes an application processor provided by a central processing device (hereinafter may also be called "CPU") 101, a RAM (Random Access Memory) 104, and a ROM (Read Only Memory) 105. In other words, the CPU 101 executes programs (such as an operating system 130 which will be described later) stored in the ROM 105 in the main controller 10, thereby performing desired procedures and controls on relevant components to implement various functions of the portable terminal. The main controller 10 also includes a DSI section 106 as a host-side interface circuit for making data exchange with the display device 11 via an interface conforming to DSI (Display Serial Interface) Standards proposed by MIPI (Mobile Industry Processor Interface) Alliance (hereinafter called "MIPI-DSI Standards").

The operation input section 16 is a section for receiving inputting operations from a user of this portable terminal, and is implemented by a touch panel and so on. The communication section 15 provides the portable terminal with wireless data exchange capability with other portable terminals. The image capture section 14 uses an image sensor to capture images of people and things and supply image signals to the main controller 10. The audio input section 17 captures ambient sounds and supply these audio signals to the main controller 10. The audio output section 18 outputs sounds based on audio data supplied from the main controller 10. The memory section 12 is provided by a memory of a greater capacity than the RAM 104, the ROM 105, etc. which are in the main controller 10, and includes memory areas to be used as a frame buffer 12$f$ which is to be described later. The display device 11 displays images represented by image data supplied from the main controller 10. The power supply section 13 supplies electric power necessary for operation of each section in the portable terminal.

Figure 2:
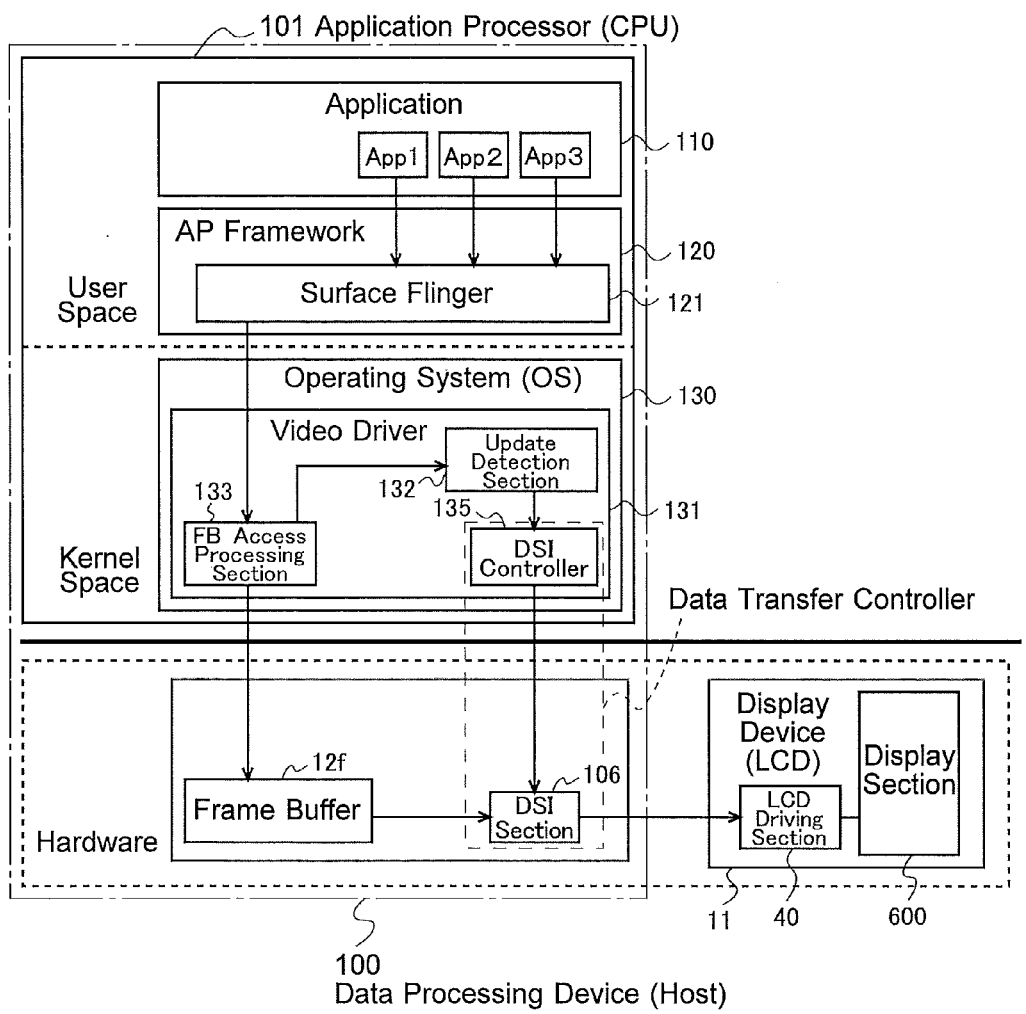
FIG. 2 is a block diagram which shows a system configuration of the data processing device according to the first embodiment, with a display device connected therewith.

FIG. 2 is a block diagram which shows a system configuration (hardware and software configurations) of the data processing device 100 according to the present embodiment, with the display device 11 connected therewith. The application processor (CPU) 101 may be provided by a single, independent IC chip, or a single CPU or a plurality of CPUs (multi-core processor) included in a system-on-chip type IC chip which includes one or more CPUs. In the present embodiment, the CPU 101 executes predetermined programs, whereby an operating system (hereinafter abbreviated as "OS") 130, which has process management capabilities, works in the kernel space, and an application frame work (hereinafter called "AP frame work") 120, which utilizes functions provided by the OS 130 thereby providing necessary functions for an application 110, works in the user space. The application 110 includes individual applications App1, App2, App3. Each individual application implements their functions intended to offer to the user by utilizing the functions of the AP frame work 120 as corresponding programs are executed by the CPU 101. It should be noted here that the OS 130 provides system functions ("signal", "wait", etc.) for synchronization between processes or threads operating on the CPU 101.

The OS 130 includes a video driver 131 as a device driver to control hardware for displaying images in the display device 11. The video driver 131 has an FB access processing section 133 and a DSI controller 135 for respectively controlling a frame buffer 12$f$ and a DSI section 106 in the data processing device (host) 100. The DSI section 106 which serves as an interface circuit and a DSI controller 135 which serves as an interface controller constitute a data transfer controller. The frame buffer 12$f$ is a memory for storing data (hereinafter called "display image data") which represents an image to be displayed in the display device 11. The FB access processing section 133 controls updating (writing) of the display image data in the frame buffer 12$f$. By using a video mode of the MIPI-interface which conforms to DSI Standards (hereinafter called "DSI video mode"), the DSI section 106 is capable of transferring a data DAT, which includes one frame-amount of display image data in the frame buffer 12$f$, to the display device 11 for each frame period (16.67 ms) (this applies to all the other embodiments, too). The DSI controller 135 can stop and resume the transfer of the data DAT from the DSI section 106 to the display device 11. It should be noted here that for operation of the DSI controller 135, the video driver 131 further has an update detection section 132 which detects whether or not the display image data in the frame buffer 12$f$ is updated by the FB access processing section 133. Detailed operation of the update detection section 132 and the DSI controller 135 will be described later.

The display device 11 connected with the data processing device according to the present embodiment is an LCD module (hereinafter, may also simply called "LCD") and has a display section 600 which makes use of liquid crystal and an LCD driving section 40. The LCD driving section 40 is connected with the data processing device 100 (i.e., DSI section 106 therein), is capable of exchanging data therewith via the interface conforming to the above-described MIPI-DSI Standards, and drives the display section 600 based on the data DAT received from the host, i.e., the data processing device 100, thereby displaying an image represented by the display image data contained in the data DAT, in the display section 600 (details will be described later).

With the configuration described above and depicted in FIG. 2, each application App1 (i=1, 2, 3, . . . ) can update an image which is displayed in the display section 600 of the display device 11 by updating display image data in the frame buffer 12$f$ by means of the FB access processing section 133 via a surface flinger 121 in the AP frame work 120 (Details will be described later). The surface flinger 121 is a component for execution and management of image drawing in the screen, and assigns a drawing area (called "surface") to each application App1. Once all of the applications App1 complete writing of data to respective surfaces, the surface flinger 121 generates data for display in the screen by combining these surfaces, and write the generated data into the image buffer 12$f$ by using the FB access processing section 133.

The above-described operations and functions of the constituent elements 132 through 135 in the video driver 131 are implemented by the CPU 101 executing programs (hereinafter called "LCD device driver program") for the video driver 131. The LCD device driver program is installed in the ROM 105, for example, which serves as a storage medium readable by the CPU 101, before the manufacturer of the portable terminal shown in FIG. 1 ships the product. Alternatively, the LCD device driver program may be recorded and offered in the form of portable recording media such as CD-ROM (Compact Disc Read Only Memory), USB memory (USB (Universal Serial Bus) flash drive), etc., for installation to the ROM 105, etc., in the portable terminal from these portable recording media, via an unillustrated interface (not illustrated) of the portable terminal in FIG. 1. Further, the LCD device driver program may be provided from a predetermined external server via a network accessible by the portable terminal and then via the communication section 15 for installation to the ROM 105, etc., in the portable terminal.

<1.2 Display Device Configuration>

Figure 3:
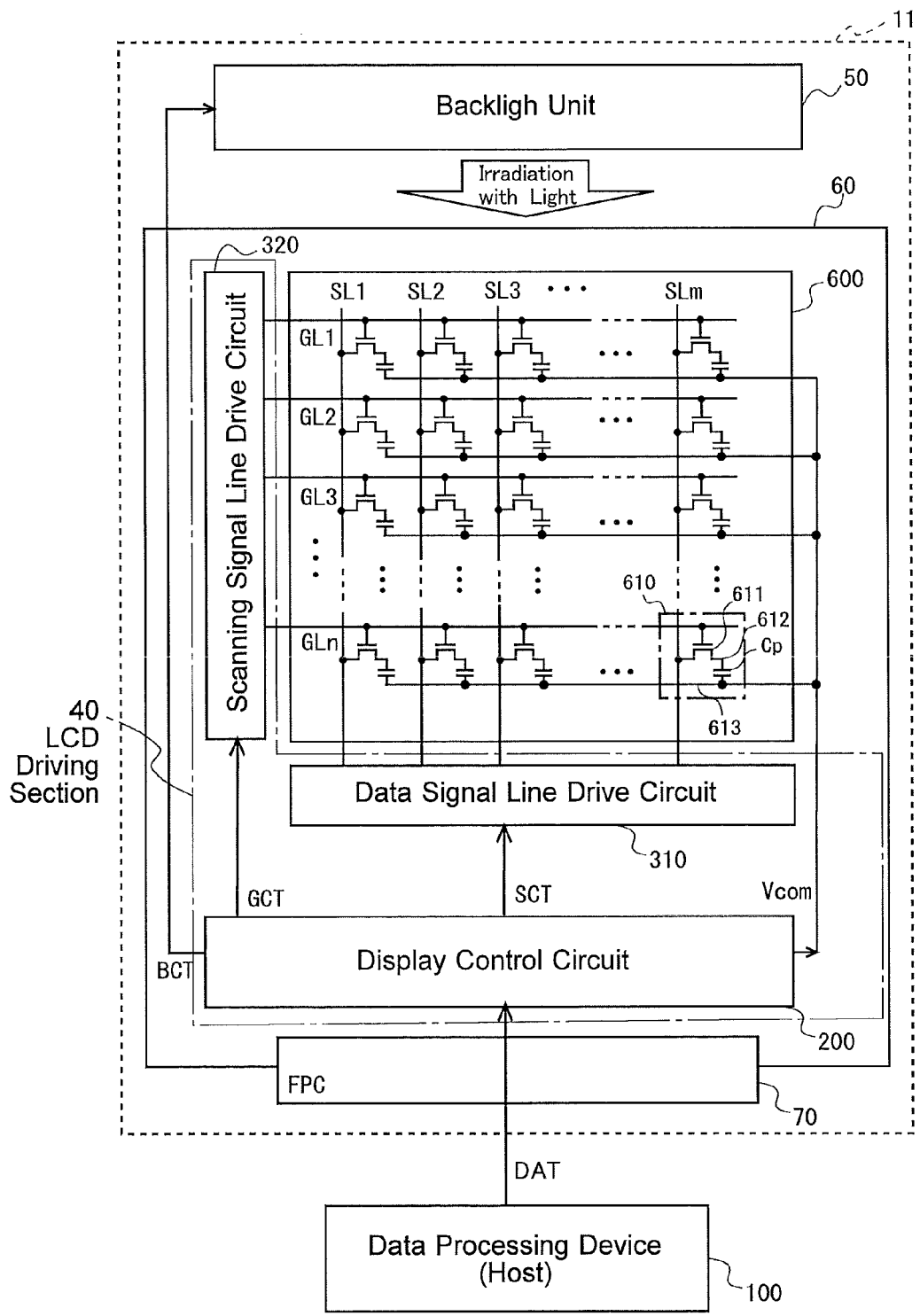
FIG. 3 is a block diagram which shows a detailed configuration of the display device connected with the data processing device according to the first embodiment.

FIG. 3 is a block diagram which shows a configuration of the display device 11 connected with the data processing device according to the present embodiment. As has been described, the display device 11 is an LCD module, and has a liquid crystal display panel 60 and a backlight unit 50. The liquid crystal display panel 60 is attached to an FPC (Flexible Printed Circuit) 70 for external connection. On the liquid crystal display panel 60, there are provided the display section 600, a display control circuit 200, a data signal line drive circuit 310, and a scanning signal line drive circuit 320. The data signal line drive circuit 310, the scanning signal line drive circuit 320 and the display control circuit 200 constitute the LCD driving section 40 described earlier (see FIG. 2). One or both of the data signal line drive circuit 310 and the scanning signal line drive circuit 320 may be provided within the display control circuit 200. Also, one or both of the data signal line drive circuit 310 and the scanning signal line drive circuit 320 may be formed integrally with the display section 600.

The display section 600 is formed with a plurality (m) of data signal lines SL1 through SLm, a plurality (n) of scanning signal lines GL1 through GLn, and a plurality (m×n) of pixel formation portions 610 disposed correspondingly to intersections made by the m data signal lines SL1 through SLm and the n scanning signal lines GL1 through GLn. Hereinafter, if these m data signal lines SL1 through SLm are not differentiated from each other, they will simply be called "data signal line SL", and if these n scanning signal lines GL1 through GLn are not differentiated from each other, they will simply be called "scanning signal lines GL". The m×n pixel formation portions 610 are formed in a matrix pattern. Each pixel formation portion 610 is constituted by: a TFT 611 which serves as a switching element having its gate terminal, serving as a control terminal, connected to a scanning signal lines GL that passes through a corresponding one of the intersections while having its source terminal connected to the data signal lines SL that passes said intersection; a pixel electrode 612 connected to a drain terminal of the TFT 611; a common electrode 613 provided commonly to the m×n pixel formation portions 610; and a liquid crystal layer sandwiched between the pixel electrode 613 and the common electrode 113 and is common to these pixel formation portions 110. In the above, the pixel electrode 612 and the common electrode 613 form a liquid crystal capacitance, which functions as a pixel capacitance Cp. It should be noted here that typically, an auxiliary capacitance is provided in parallel to the liquid crystal capacitance for ensured voltage holding at the pixel capacitance Cp. Therefore, the pixel capacitance Cp is actually constituted by the liquid crystal capacitance and the auxiliary capacitance.

In the present embodiment, the TFT 611 is provided by a TFT which includes an oxide semiconductor layer as its channel layer (hereinafter called "oxide TFT") and has a channel etch structure. In this channel-etch-structure TFT, the source electrode and the drain electrode are disposed on the oxide semiconductor layer, at a space from each other, to sandwich a channel region of the transistor, with the source electrode and the drain electrode having their mutually opposed ends in contact with the oxide semiconductor layer. In other words, the source electrode and the drain electrode are disposed to make contact with an upper surface of the oxide semiconductor layer. The oxide semiconductor layer includes an In—Ga—Zn—O semiconductor (oxide semiconductor of an indium, gallium and zinc). Hereinafter, such a TFT will be called "CE-InGaZnO-TFT". It should be noted here that the oxide semiconductor layer may have a laminated structure including two or more layers.

An In—Ga—Zn—O semiconductor includes a ternary oxide containing In (indium), Ga (gallium) and Zn (zinc). There is no specific limitation to proportion (ratio) between In, Ga and Zn, so the ratio may be In:Ga:Zn=2:2:1, In:Ga: Zn=1:1:1, In:Ga:Zn=1:1:2, and so on. In the present embodiment, a semiconductor film which contains In, Ga and Zn at a ratio of 1:1:1 is utilized. A TFT, which includes an In—Ga—Zn—O semiconductor layer, has a high mobility (greater than 20 times as compared to those which make use of an amorphous silicon in its channel layer, or those called a-SiTFT) and low leak current (smaller than $\frac{1}{100}$ as compared to an a-SiTFT); and therefore, is suitable as a driving TFT and a pixel TFT. Use of TFT which includes an In—Ga—Zn—O semiconductor layer makes it possible to dramatically reduce power consumption in a display device.

The oxide semiconductor layer may be made from whichever one of amorphous, crystalline and microcrystalline materials. If the oxide semiconductor layer has a laminated layer structure, these materials may be used in whichever combinations. When crystalline In—Ga—Zn—O semiconductors are utilized, it is preferable that the crystalline In—Ga—Zn—O semiconductors have their c axis substantially vertical to the layer surface. Crystal structures of the In—Ga—Zn—O semiconductors described above are disclosed in JP-A 2012-134475 Gazette. The entire contents disclosed in JP-A 2012-134475 Gazette are incorporated herein by reference.

The oxide semiconductor layer may include other oxide semiconductors in place of the In—Ga—Zn—O semiconductors. For example, the layer may contain In (indium), Sn (tin), Zn (zinc) in the form of an In—Sn—Zn—O semiconductor (such as $In_2O_3$—$SnO_2$—ZnO). Other examples include Zn—O semiconductors (ZnO), In—Zn—O semiconductors, Zn—Ti—O semiconductors, Cd—Ge—O semiconductors, Cd—Pb—O semiconductors, CdO (Cadmium oxide), Mg—Zn—O semiconductors, and In—Ga—Sn—O semiconductors. It should be noted here that use of an oxide TFT as the TFT 611 represents one example; a silicon TFT may be used instead.

The display control circuit 200 is implemented typically as an IC (Integrated Circuit). The display control circuit 200 receives data DAT from the host 100 via an FPC 70, and in response to this, generate and outputs a data-side control signal SCT, a scanning-side control signal GCT, and a common voltage Vcom. The data-side control signal SCT is supplied to the data signal line drive circuit 310. The scanning-side control signal GCT is supplied to the scanning signal line drive circuit 320. The common voltage Vcom is supplied to the common electrode 613. In the present embodiment sending/receiving of the data DAT between the host 100 and the display control circuit 200 is performed via an MIPI-DSI interface which conforms to DSI Standards as has been described. The interface conforming to MIPI-DSI Standards enables high-speed data transfer.

The data signal line drive circuit 310 generates and outputs data signal to be supplied to the signal lines SL, based on the data-side control signal SCT. The data-side control signal SCT contains, for example, a digital image signal corresponding to RGB data RGBD, a source start pulse signal, a source clock signal, a latch strobe signal, and a polarity switching signal. In accordance with the source start pulse signal, the source clock signal and the latch strobe signal, the data signal line drive circuit 310 operates its unillustrated shift register, sampling latch circuit, etc., obtains digital signals based on digital image signals, converts the obtained digital signals with an unillustrated DA conversion circuit, and thereby generates data signals.

The scanning signal line drive circuit 320 repeats application of active scanning signals to the scanning lines GL in accordance with the scanning-side control signal GCT at a predetermined cycle. The scanning-side control signal GCT contains, for example, a gate clock signal and a gate start pulse signal. The scanning signal line drive circuit 320 operates its unillustrated shift register, etc. in accordance with the gate clock signal and gate start pulse signal, and thereby generates scanning signals.

The backlight unit 50 is on a back side of the liquid crystal display panel 60, and irradiate the back surface of the liquid crystal display panel 60 with backlight. The backlight unit 50 typically includes a plurality of LEDs (Light Emitting Diodes). The backlight unit 50 may be controlled by the display control circuit 200, or controlled by other method. If the liquid crystal display panel 60 is of a reflection type, then it is not necessary to have the backlight unit 50.

As described above, data signals are applied to the data signal line SL, scanning signals are applied to the scanning signal lines GL and the backlight unit 50 is driven, whereby an image represented by display image data sent from the host 100 is displayed in the display section 600 of the liquid crystal display panel 60.

<1.3 Intermission Driving>

The display device 11 which is connected with a data processing device according to the present embodiment has a normal driving mode and an intermission driving mode as driving modes of the display section 600. In the normal driving mode, the liquid crystal display device 11 repeats sequential scanning of the gate lines GL1 through GLn using one frame period (1 vertical scanning period) as a cycle while driving the source lines SL1 through SLm, whereby a display image in the display section 600 is refreshed every frame period.

In the intermission driving mode, on the other hand, the display control circuit 200 controls the data signal line drive circuit 310 and the scanning signal line drive circuit 320 in such a manner that that a refreshing period (hereinafter may also called "RF period " in which a display image is refreshed and a non-refreshing period (hereinafter also called NRF period ") in which all the gate lines GL1 through GLn are brought into a de-selected state are alternated with each other.

Figure 4:
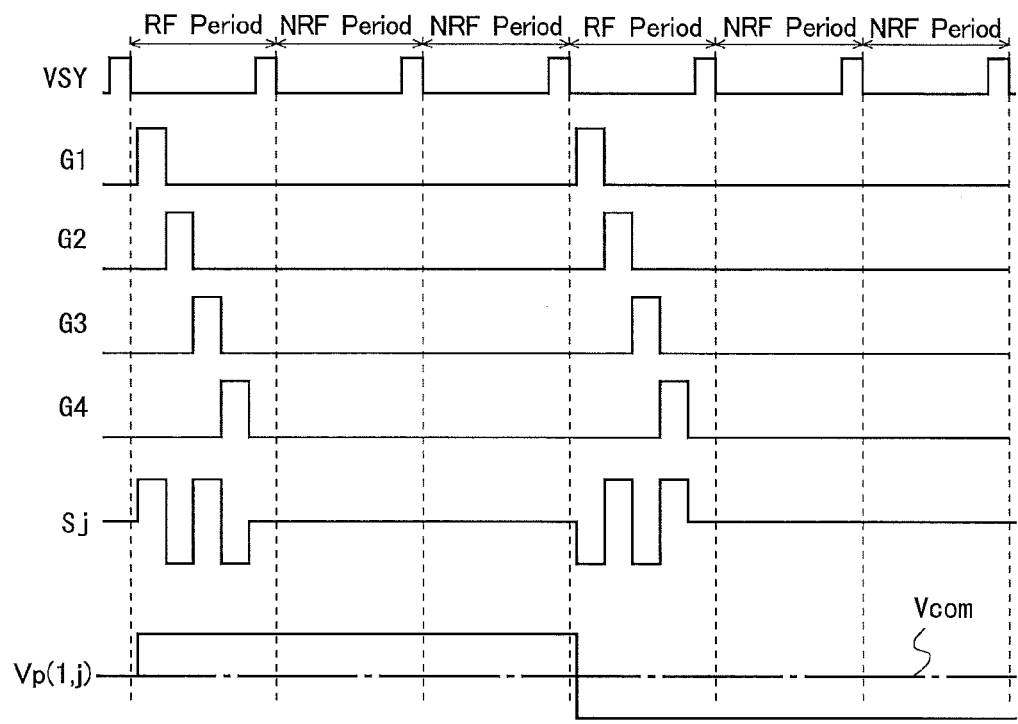
FIG. 4 is a signal waveform chart for describing an operation of the display device in an intermission driving mode.

FIG. 4 is a signal waveform chart for describing an operation of the display device 11 in an intermission driving mode. For descriptive convenience, FIG. 4 assumes the number of scanning signal lines, i.e., gate lines, as n=4. In the present embodiment, a pixel voltage which is held as a pixel data at a pixel capacitance Cp in each of the pixel formation portions 610 is re-written at a predetermined cycle (see FIG. 3) whenever an image is displayed in the display section 600. In other words, a display image in the display section 600 is refreshed at a predetermined cycle. In the present embodiment, the refreshing cycle is made of three frame periods, composed of one frame period as the refreshing period, and two frame periods that follow as the non-refreshing periods. As shown in FIG. 4, during the refreshing period (RF period), scanning signals G1 through G4 which are applied to the gate lines GL1 through GL4 sequentially become active (HIGH level), while in each source line SLj, polarity of data signal Sj is inverted for each horizontal period (j=1, 2, . . . , m). During the non-refreshing period (NRF period), all of the scanning signals G1 through G4 are inactive. FIG. 4 also shows a waveform of the voltage Vp (1, j) at a pixel formation portion 610 in the first row of the j-th column which is connected with the gate line GL1 and the source line SLj, together with the common voltage Vcom. Since the refreshing cycle is made of 3 frame periods as described earlier, the polarity of the pixel voltage Vp(1, j) with respect to the common voltage Vcom as a baseline is inverted for every three frame periods as shown in FIG. 4 (this also applies to pixel electrode polarity in other pixel formation portions).

As has been described, "one frame period" is a period for refreshing one screen, and the length of one frame period in the present embodiment is equal to a commonly utilized length of one frame period (16.67 ms) used in display devices of a refreshing rate of 60 Hz. In FIG. 4, each frame period is defined by a vertical synchronization signal VSY which assumes HIGH level for each frame period. The refreshing cycle in the present embodiment may be made of any number of periods as far as it is not shorter than two frame periods; a specific number thereof is determined with consideration to, e.g., how often the display section 600 will experience the image to be displayed therein (this also applies to all the other embodiments which will be described later). For example, the refreshing cycle may be 60 frame periods consisting of one frame period as the refreshing period and 59 frame periods that follow as the non-refreshing period. In this case, the refreshing rate is 1 Hz. Also, the refreshing period may be two frame periods or longer (the same applies to the other embodiments which will be described later).

<1.4 Display Control Circuit Configuration>

Next, a configuration of the display control circuit 200 will be described. The display control circuit 200 in the display device 11 connected with a data processing device according to the present embodiment utilizes a DSI video mode and does not have a RAM which serves as a frame buffer.

Figure 5:
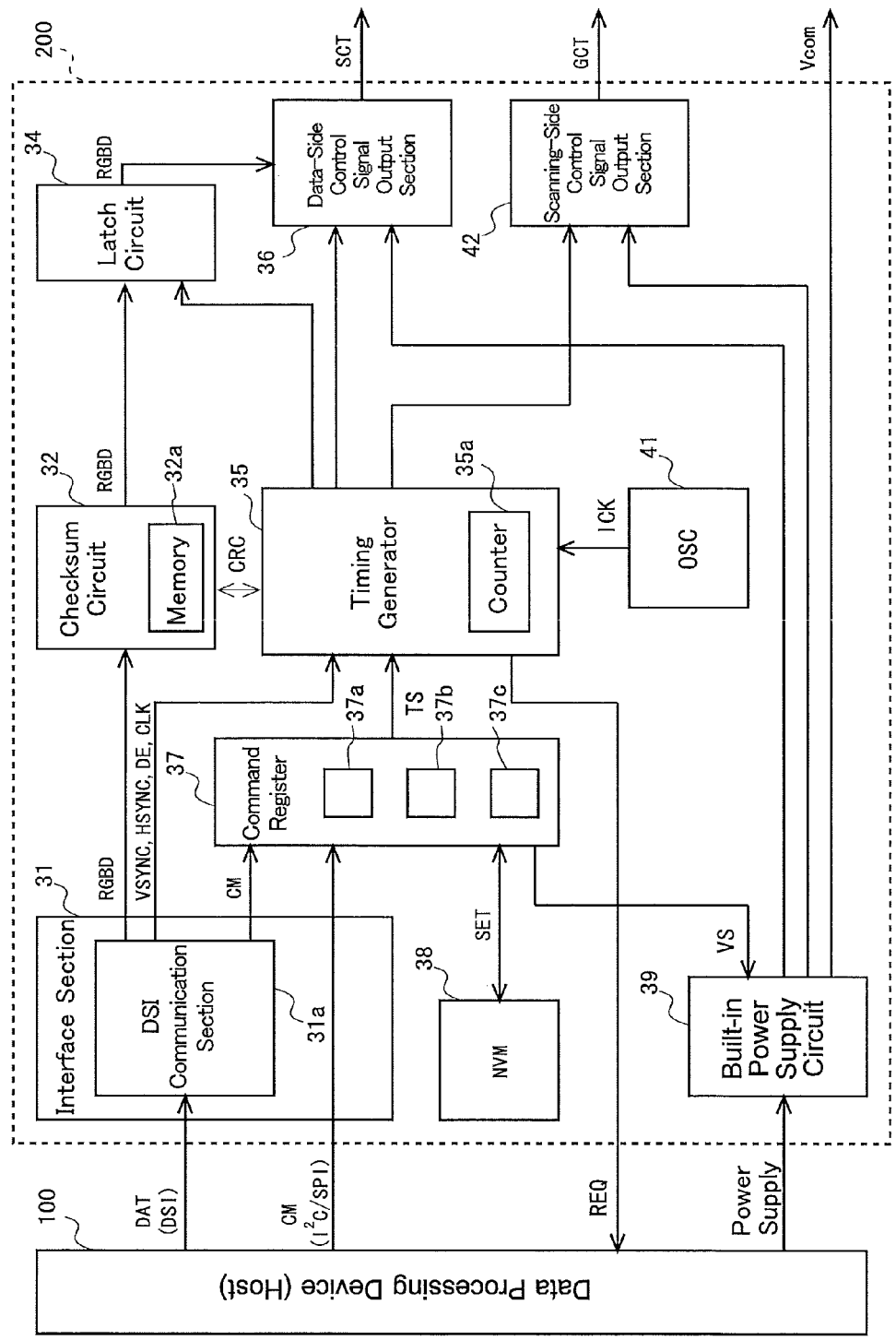
FIG. 5 is a block diagram which shows a configuration of a display control circuit in the display device connected with the data processing device according to the first embodiment.

FIG. 5 is a block diagram which shows a configuration of the display control circuit 200. The display control circuit 200 includes an interface section 31, a command register 37, an NVM (Non-volatile memory) 38, a timing generator 35, an OSC (Oscillator) 41, a checksum circuit 32, a latch circuit 34, a built-in power supply circuit 39, a data-side control signal output section 36, and a scanning-side control signal output section 42. The interface section 31 includes a DSI communication section 31a which conforms to MIPI-DSI Standards, whereas the checksum circuit 32 includes a memory 32a. Also, the timing generator 35 includes a counter 35a, and the command register 37 includes registers 37a through 37c The DSI communication section 31a which conforms to MIPI-DSI Standards receives data DAT from the host 100 in the video mode. The data DAT contains RGB data RGBD which represents image-related data, a vertical synchronization signal VSYNC and horizontal synchronization signal HSYNC serving as synchronization signals, a data enable signal DE, a clock signal CLK and command data CM. The command data CM contains data related to various controls. Upon receiving the data DAT from the host 100, the DSI communication section 31a supplies the RGB data RGBD which is contained in the data DAT to the latch circuit 34 via the checksum circuit 32; supplies the vertical synchronization signal VSYNC, the horizontal synchronization signal HSYNC, the data enable signal DE, and the clock signal CLK to the timing generator 35, and supplies the command data CM to the command register 37. It should be noted here that the command data CM may be sent from the host 100 to the command register 37 via an interface which conforms to I2C (Inter Integrated Circuit) Standards or SPI (Serial Peripheral Interface) Standards. In this case, the interface section 31 includes a receiver section which conforms to I2C Standards or SPI Standards. The RGB data RGB will also be called "image data"; the vertical synchronization signal VSYNC, the horizontal synchronization signal HSYNC, the data enable signal DE, and other signals may be collectively called "timing signals".

The interface section 31 is configured to transfer information which is related to LCD driving and is held in the display control circuit 200, to the data processing device 100, i.e., to the host, via the interface conforming to MIPI-DSI Standards or an interface conforming to I2C Standards or SPI Standards, upon issuance of a predetermined command from the host. Examples of the information include counter values such as a non-refreshing count which will be described later, a polarity imbalance count, and command data such as non-refreshing frame count NREF which will be described later. Further, the interface section 31 is configured to stop specific circuits within the display control circuit 200 upon issuance of a predetermined command from the host, and turn off power supply to said specific circuits (see FIG. 9 which will be described later and read relevant description therefor).

The checksum circuit 32 is configured to perform an arithmetic operation (checksum) to obtain a checksum value and store the obtained checksum value in the memory 32a each time it receives one screen-ful of RGB data RGBD. Specifically, the checksum circuit 32 obtains a checksum value of a set of RGB data RGBD for a given frame (preceding frame), stores the obtained checksum value in the memory 32a, and then obtain a checksum of a set of RGB data RGBD for the frame that follows immediately after (current frame or subsequent frame). The checksum value of the current frame and the checksum value of the preceding frame stored in the memory 32a are compared to each other. If the two values are equal to each other, it is determined that the two images are identical with each other; if the two values are different from each other, it is determined that the two images are different from each other. The result is a checksum result data CRC, which is then sent to the timing generator 35. The checksum circuit 32 is utilized as described above because it is easy to reliably determine whether or not the RGB data RGBD is updated, and the method does not require a memory of a large capacity. The checksum circuit 32 may also be called "image-change detection circuit". Alternative arithmetic operations other than checksum may be utilized to determine whether or not the images are identical. In such a case, the checksum circuit 32 is replaced with a different circuit for such an arithmetic operation. Hereinafter, description will assume that the checksum value is a result of checksumming a set of one screen-ful of image data and is a value obtained for each frame. However, a checksum value may be obtained from predetermined lines or a predetermined block for example.

The command register 37 holds command data CM. The command register 37 has three registers 37a through 37c, each storing a value for a different setting from others. An example is a non-refreshing frame count NREF which determines the number of frames for which refreshing is not performed.

The NVM 38 holds setting data SET for various kinds of control. The command register 37 reads the setting data SET which is held in the NVM 38, and also updates the setting data SET in response to command data CM. The command register 37 supplies the timing control signal TS and the setting values stored in the registers 37a through 37c to the timing generator 35, and a voltage setting signal VS to the built-in power supply circuit 39 in response to the command data CM and the setting data SET.

The timing generator 35 receives the checksum result data CRC from the checksum circuit 32. If the checksum result data CRC indicates that the RGB data RGBD is not been changed, the timing generator 35 increments the value of the counter 35a, and then compares said value of the counter 35a with the non-refreshing frame count NREF which is stored in the register 37c. If the value of the counter 35a is smaller than the non-refreshing frame count NREF, refreshing is not performed. As a result, the same image is continuously displayed in the display section 600. On the other hand, if the value of the counter 35a is greater than the non-refreshing frame count NREF, a control signal necessary to perform screen refreshing is supplied to the latch circuit 34 and the counter 35a is reset.

The timing generator 35 generates control signals for controlling the latch circuit 34, the data-side control signal output section 36 and the scanning-side control signal output section 42 based on the vertical synchronization signal VSYNC, the horizontal synchronization signal HSYNC, the data enable signal DE, the clock signal CLK and a built-in clock signal ICK which is generated in the OSC 41, and provides the signals to respective components.

When performing refreshing, there can be a case where the timing generator 35 requests the host 100 to send data DAT. In this case, a request signal REQ is generated based on vertical synchronization signal VSYNC, horizontal synchronization signal HSYNC, data enable signal DE, clock signal CLK, timing control signal TS, and built-in clock signal ICK generated in the OSC 41, and the generated request signal REQ is sent to the host 100. Upon receiving the request signal REQ, the host 100 sends the data DAT to the DSI communication section 31a of the display control circuit 200. It should be noted here that the OSC 41 is not an essential constituent element if the display control circuit 200 has a Video Mode RAM Through configuration.

The latch circuit 34 provides the data-side control signal output section 36 with RGB data RGBD for each line based on a control signal from the timing generator 35. As described above, screen refreshing is performed at a necessary timing, thereby replacing an image which is currently displayed in the display section 600 with the same or a changed image.

The built-in power supply circuit 39 generates and outputs a power voltage, and a common voltage Vcom, for use at the data-side control signal output section 36 and the scanning-side control signal output section 42, based on electric power from the host 100 and a voltage setting signal VS from the command register 37.

The data-side control signal output section 36 generates a data-side control signal SCT based on the RGB data RGBD from the latch circuit 34, the control signal from the timing generator 35, and a power source voltage from the built-in power supply circuit 39; and provides this signal to the data signal line drive circuit 310.

The scanning-side control signal output section 42 generates a scanning-side control signal GCT based on the control signal from the timing generator 35 and the power source voltage from the built-in power supply circuit 39; and provides this signal to the scanning signal line drive circuit 320.

It should be noted here that since the display device 11 is provided by an LCD module, AC driving is utilized to drive the display section 600 to avoid deterioration of the liquid crystal. In other words, polarity (voltage polarity at the pixel electrode 612 with respect to the voltage Vcom at the common electrode 613 as a baseline) of data signal supplied to each pixel formation portion 610 in the display section 600 is inversed for every predetermined period (hereinafter, this predetermined period will be called "inversion cycle")

for a purpose that the voltage applied to the liquid crystal in the display section 600 will have a time average value or an integral value of "zero". In an intermission driving mode, however, the inversion cycle is significantly longer than in normal driving mode. Because of this, impurity ions distributed unevenly in the liquid crystal of the display section 600 can create a large accumulation of charge (hereinafter simply called "charge imbalance"), and there can be cases where power supply to the display device is turned OFF while the charge imbalance is large. To solve this, there is an arrangement that a total time for which a positive-polarity data voltage was applied to a specific pixel formation portion in the display section 600 and a total time for which a negative-polarity data voltage was applied to the same specific pixel formation portion are monitored; a difference between the two values is held by a predetermined counter; and the value in the counter is updated as the polarity inversion goes on (hereinafter this counter will be called "polarity imbalance counter"). In this case, the value of the polarity imbalance counter is another consideration in determining the refreshing timing of display image.

<1.5 Video Driver Operation in the Host>

Next, an operation of the data processing device (host) 100 for displaying an image in the display device 11 configured as described above will be described with reference to FIG. 2, and FIG. 6 through FIG. 8, with a focus on how the video driver 131 operates. In the following description, the CPU 101 includes several timers for use in its operation; specifically, a period timer for periodic interruption at an interval of one frame period; a refreshing start timer which sets an amount of time until a start of refreshing as will be described later; and a refreshing preparation timer which sets an amount of time until a start of preparation for returning from Intermission State 2 which will be described later to the normal state. As each timer times out when the set amount of time has passed, a corresponding timer interruption takes place.

As has been described, when updating a display image, each application Appi (i=1, 2, 3, . . . ) rewrites display image data in the frame buffer 12ƒ (display image data updating) by using the FB access processing section 133 via the surface flinger 121 in the AP frame work 120 (see FIG. 2). In this procedure, the FB access processing section 133 notifies the update detection section 132 of an access event which indicates a data updating event in the frame buffer 12ƒ. The notification takes a form of a function provided by the OS 130 for synchronization (e.g. system function such as a "signal").

Figure 6:
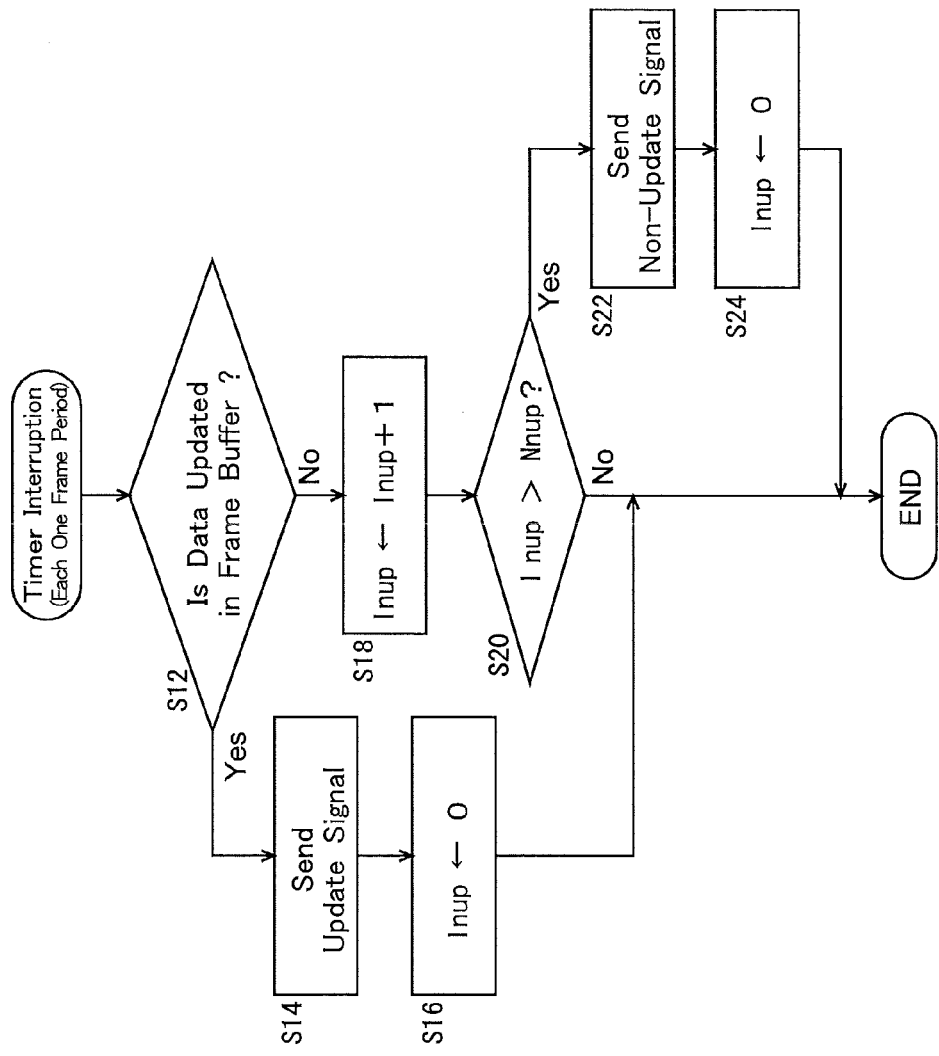
FIG. 6 is a flow chart which shows a processing procedure performed by an interrupt handler which implements an update detection section included in a video driver in the first embodiment.

The update detection section 132 is implemented as a timer interrupt handler which is activated by the timer interruption generated by the above-described period timer at intervals of one frame period (16.67 ms in the present embodiment). FIG. 6 is a flow chart which shows a processing procedure by the timer interrupt handler. Upon the timer interruption, the CPU 101 operates as follows:

First, presence or absence of the above-described access event notification is checked to determine if display image data in the frame buffer 12ƒ is updated (Step S12). For this determination, a function of the OS 130 (e.g. a system function such as "wait") for receiving the access event is utilized.

If the result of determination in Step S12 indicates that the display image data in the frame buffer 12ƒ is updated, the CPU proceeds to Step S14 and sends a signal to notify the update of the display image data (hereinafter called "update signal"), to the DSI controller 135 (Step S14). Thereafter, a variable which indicates a length of the periods during which the display image data has not been updated (hereinafter called "non-update variable") Inup is reset to "0" (Step S16), and then this timer interrupt handler is terminated.

If the result of determination in Step S12 does not indicate an update of the display image data in the frame buffer 12ƒ, the CPU proceeds to Step S18 and increases the value of the non-update variable Inup by "1" (Step S18), and thereafter, checks whether or not this non-update variable Inup is greater than a predetermined criterion value Nnup ("2" for example) (Step S20). If the result of determination shows that the non-update variable Inup is not greater than the criterion value Nnup, this timer interrupt handler is terminated. If the result of determination shows that the non-update variable Inup is greater than the criterion value Nnup, a signal which indicates that updating of the display image data in the frame buffer 12ƒ has not been performed for a predetermined time (hereinafter called "non-update signal") is sent to the DSI controller 135 (Step S22). However, sending of the non-update signal is not executed if the DSI controller 135 is in an intermission state (Intermission State 1 or 2, with Video OFF) (in other words, from an execution time point of Step S45, through steps shown in FIG. 8, to Step S35) which will be described later. Once the non-update signal is sent, the non-update variable Inup is reset to "0" (Step S24), and this timer interrupt handler is terminated. The criterion value Nnup is a value selected for a judgment that the display image should be regarded as a still image if the non-update variable Inup is greater than the criterion value Nnup. Therefore, the criterion value Nnup is not limited to "2"; rather, any appropriate value greater than "1" may be selected as a criterion to see if an image to be displayed is a changed image. The non-update variable Inup is initialized to "0" when the data processing device 100 is started.

This timer interrupt handler is started every frame period as has been described, but once started, it is terminated within a much shorter period than one frame period as will be understood from FIG. 6.

Next, an operation of the DSI controller 135 in the video driver 131 will be described. In the DSI video mode, display image data is transferred from the host, i.e., the data processing device 100, to the display device 11 for each frame period. In the present embodiment, however, in order to reduce power consumed by the host in the intermission driving mode, the DSI controller 135 has two operation states, i.e., Normal State (Video ON) in which display image data is transferred to the display device 11 for each frame period, and Intermission State (Vide OFF) in which transfer of display image data to the display device 11 is stopped when there is no need for updating the display image in the display device 11. The DSI controller 135 is implemented as a process (including threads) which operates as part of the OS 130 in the kernel space, or in other words implemented as a system process, and this system process enters a sleep state in the above-described Intermission State, under a process management by the OS 130 (a system function such as "sleep" is utilized for this).

Figure 7:
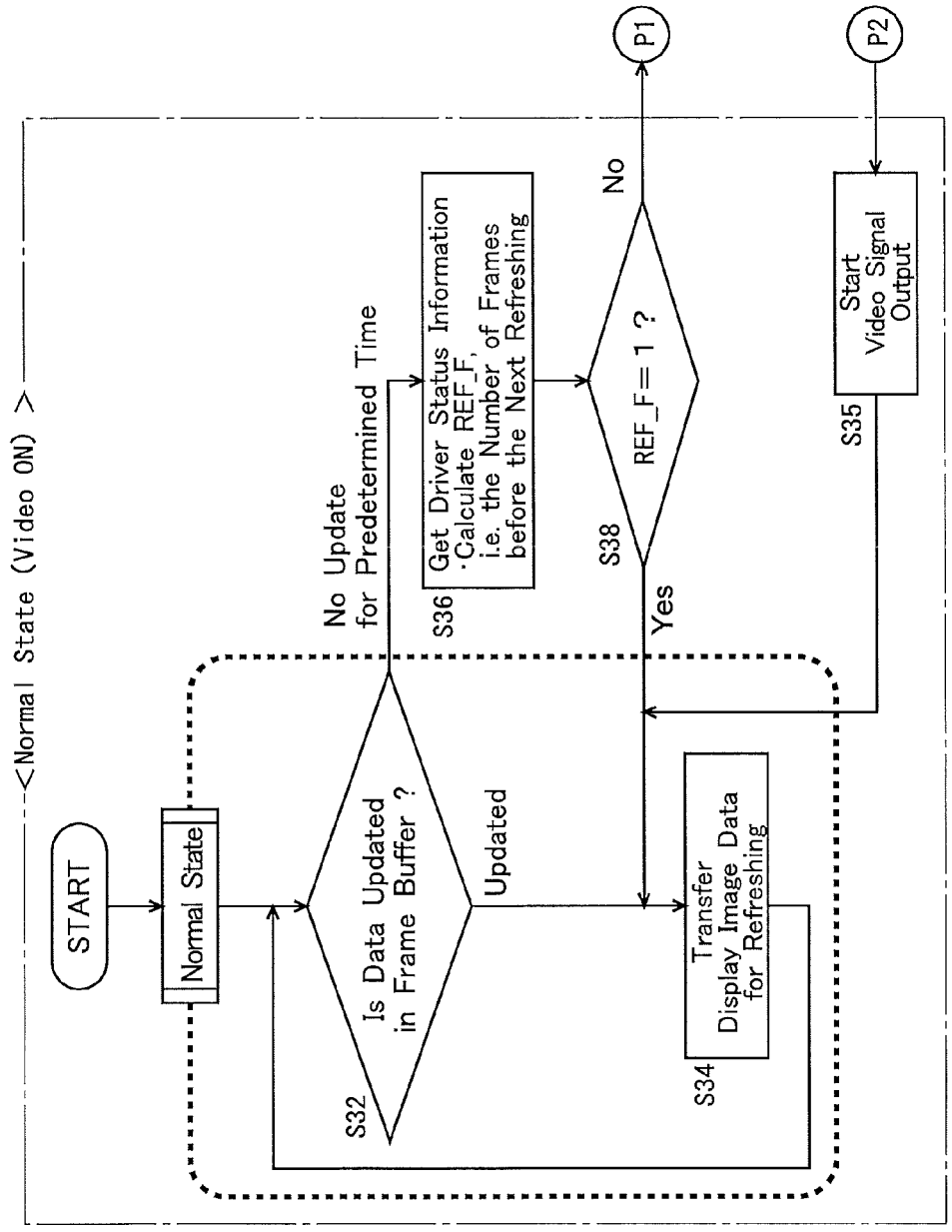
FIG. 7 is a flow chart which shows a processing procedure, under a normal state, of a program which implements a DSI controller included in the video driver in the first embodiment.
Figure 8:
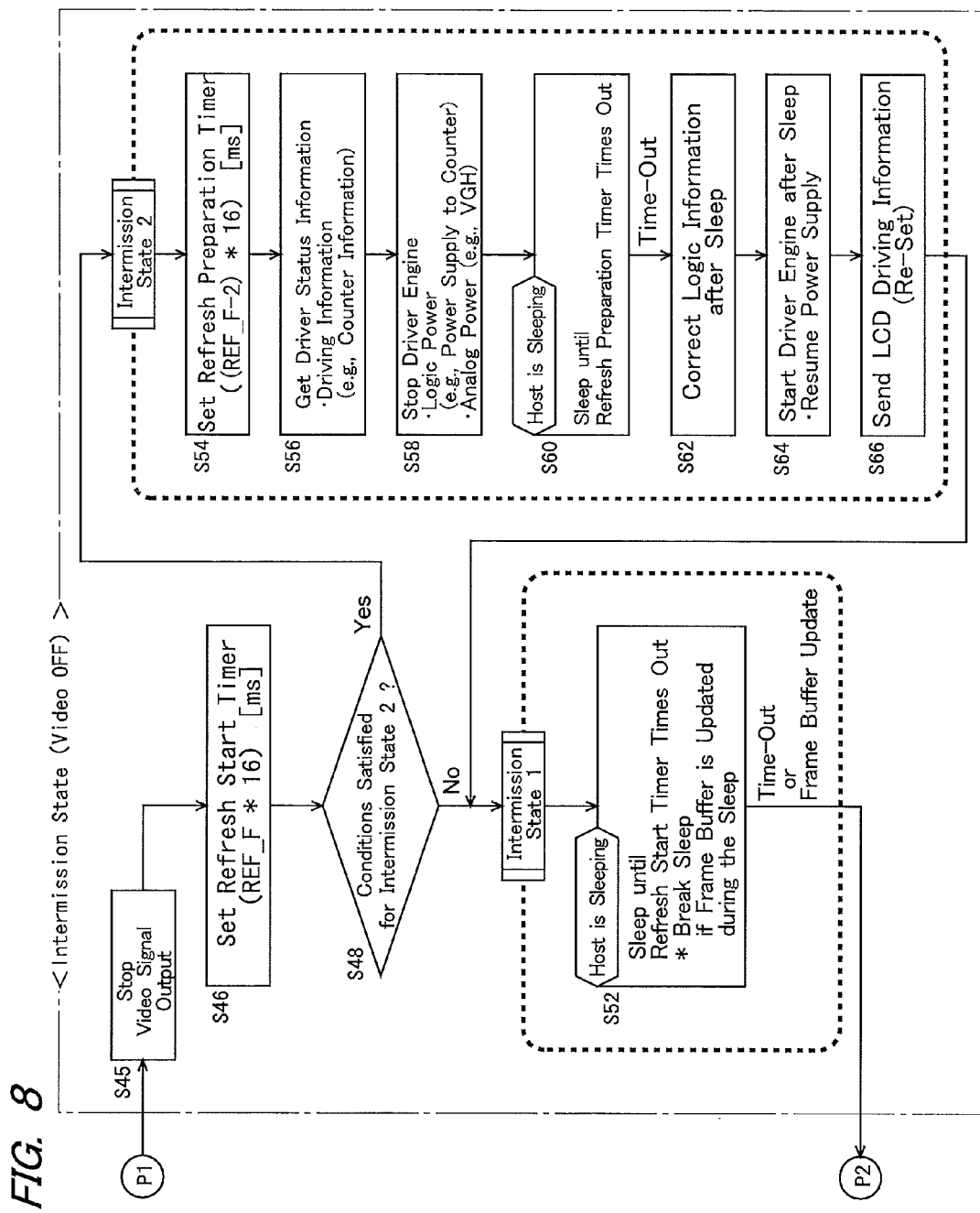
FIG. 8 is a flow chart which shows a processing procedure, under an intermission state, of a program which implements the DSI controller included in the video driver in the first embodiment.

FIG. 7 is a flow chart which shows a processing procedure of the DSI controller 135 in Normal State; FIG. 8 is a flow chart which shows a processing procedure of the DSI controller 135 for shifting from Normal State to Intermission State 1 or 2, and a processing procedure of the DSI controller 135 for returning to Normal State from Intermission State 1 or 2 (Hereinafter, simply called "processing procedure of the DSI controller for Intermission State"). When the data processing device 100 serving as the host is started, the CPU 101 operates as shown in FIG. 7 and FIG. 8, thereby implementing the DSI controller 135 as a process in the kernel space.

Specifically, when the data processing device 100 is started, the CPU 101 determines whether or not display image data in the frame buffer 12f is updated (Step S32). The determination is made by receiving an update signal or a non-update signal from the timer interrupt handler (see Steps S14 and S22 in FIG. 6) (system function such as "wait" is utilized for receiving a signal like this). If in Step S32 an update signal is determined to be received, the CPU proceeds to Step S34, following the recognition that there was an update of the display image data in the frame buffer 12f. In Step S34, the DSI section 106 is caused to transfer the post-update display image data which is stored in the frame buffer 12f to the display device 11. Thereafter, the CPU returns to Step S32. The display device 11 which receives the display image data performs the steps as has been described earlier, to display an image that is represented by this display image data in the display section 600, whereby refreshing of the display image is achieved (see FIG. 3 and FIG. 5).

If a non-update signal is determined to be received in Step S32, it means that display image data in the frame buffer 12f is not updated for a predetermined amount of time. In this case, the CPU proceeds to Step S36 to obtain driver status information, i.e., information regarding driving state at the display device 11 (hereinafter called "LCD driving information"). This LCD driving information contains a count of the frames in the non-refreshing period (value in the counter 35); a value which indicates a difference between a total time for which a positive-polarity data voltage was applied to a specific pixel formation portion in the display section 600 and a total time for which a negative-polarity data voltage was applied to the same specific pixel formation portion (value in the polarity imbalance counter); etc., and therefore can be understood as information regarding determination on refreshing timing of display image in the display device 11 (hereinafter called "refreshing-related information"). In the present embodiment, at least a value in the counter 35 (hereinafter called "non-refreshing count") in the display control circuit 200 (FIG. 5) is obtained as the LCD driving information. Also, in cases where the earlier-described polarity imbalance counter is provided in the display control circuit 200, a value of the polarity imbalance counter (hereinafter called "polarity imbalance count") is also obtained as part of the LCD driving information.

The above-described LCD driving information from the display device 11 is obtained by using commands conforming to MIPI-DSI Standards, via an interface conforming to MIPI-DSI Standards. Alternatively, the information from the display device 11 may be obtained via an interface which conforms to I2C Standards or SPI Standards (see FIG. 5). Such an arrangement will be described later as a second embodiment. In Step S36, the LCD driving information, which includes information from counters such as non-refreshing count, is obtained from the display device 11 as described, and then based on the obtained LCD driving information, a calculation is made for the number of frames preceding the next refreshing of the display image (hereinafter called "refreshing start preceding frame count") REF_F.

Next, the CPU determines whether or not this refreshing start preceding frame count REF_F is "1" (Step S38). If the result of determination indicates that the refreshing start preceding frame count REF_F is "1", the CPU proceeds to Step S34 to cause the DSI section 106 to transfer display image data stored in the frame buffer 12f to the display device 11. Thereafter, the CPU returns to Step S32. The display device 11 refreshes the display image using this display image data. On the other hand, if the result of determination indicates that the refreshing start preceding frame count REF_F is not "1", i.e., is "2" or a greater number, the CPU proceeds to Step S45 in FIG. 8 in order to bring the DSI controller 135 into the intermission state.

Moving to Step S45 in FIG. 8 means that the display device 11 is operating in the intermission driving mode and displaying a still image. Based on this, the DSI section 106 is caused to stop transferring display image data to the display device 11. In other words, video signal output from the data processing device 100 to the display device 11 is stopped. Thereafter, a setting is made to the earlier-described refreshing start timer (Step S46) for a timeout after a length of time equal to the refreshing start preceding frame count REF_F from the current time point. Since one frame period is 16.67 ms in the present embodiment, the length of time set to the refreshing start timer is (REF_F*16) ms. Thereafter, the CPU proceeds to Step S48.

In the present embodiment, the intermission state of the DSI controller 135 consists of two levels, i.e., Intermission State 1 and Intermission State 2. Depending on a driving state of the display device 11 at a time point when a determination is made to shift from Normal State to Intermission State, selection is made as to which of the Intermission State 1 and Intermission State 2 the shifting should be made to. Intermission State 2 is selected if it is possible to stop a greater number of circuits in the display device 11 or to turn off a greater number of power supplies for greater power saving than in Intermission State 1. In Step S48 CPU 101 determines which of Intermission State 1 and Intermission State 2 should be selected. In this embodiment, Intermission State 1 is selected if the refreshing start preceding frame count REF_F calculated in Step S36 is not greater than "10", whereas Intermission State 2 is selected if the number is greater than "10". It should be noted here that the selection criteria is not limited to whether or not the refreshing start preceding frame count REF_F is not greater than "10", but selection may be made by taking characteristics, operating conditions, etc. of the display device 11 into consideration.

If the result of determination in Step S48 shows that the refreshing start preceding frame count REF_F is not greater than 10, shifting should be made to Intermission State 1 so the CPU proceeds to Step S52. In Step S52, the host (DSI controller 135 therein) assumes a sleep state. Specifically, under a process management by the OS 130, the CPU 101 executes system functions for bringing the process which is working as the DSI controller 135 into the sleep state. The process which assumes the sleep state, i.e., the process which is now stopped, is resumed (brought back to an active state) when the refreshing start timer times out as the earlier-mentioned length of time (REF_F*16) ms has elapsed. However, even before the elapse of the time (REF_F*16) ms, the process management is configured to resume the process if it receives an update signal (Step S14 in FIG. 6) based on an update of display image data in the frame buffer 12f. Following the steps described above, the DSI controller 135 in the sleep state returns to Normal State as the CPU moves from Step S52 to the next Step S35 (FIG. 7) when the refreshing start timer times out or display image data in the frame buffer 12f is updated.

Step S35 causes the DSI section 106 to resume its operation for transferring display image data to the display device 11. In other words, video signal output from the data processing device 100 to the display device 11 is started. Thereafter, the CPU proceeds to Step S34 to cause the DSI section 106 to transfer display image data in the frame buffer 12*f* to the display device 11, and then the CPU returns to Step S32. It should be noted here that the DSI communication section 31*a* in the display control circuit 200 is configured to resume its operation if it receives a video signal (specifically, the vertical synchronization signal VSYNC) from the host in the intermission state (power saving state).

If the result of determination in Step S48 indicates the condition for shifting to Intermission State 2 is satisfied (if the refreshing start preceding frame count REF_R is greater than 10 in the present embodiment), the CPU proceeds to Step S54. In Step S54, an amount of time ((RERF_F−2)*16) ms is set to the refreshing preparation timer so that the timer will time out once a length of time shorter than the refreshing start preceding frame count REF_F by "2" has elapsed from the current time point. A reason for making such a time setting as the above is to secure a preparation period for a forthcoming refreshing of the display image. In other words, two frame periods are secured as a resumption period (resumption state period) for returning from Intermission State 2 to Normal State. The preparation period is not limited to two frame periods; a selection may be made appropriately by taking into account such a factor as an amount of time necessary for processing a resumption state which will be described later.

Figure 9:
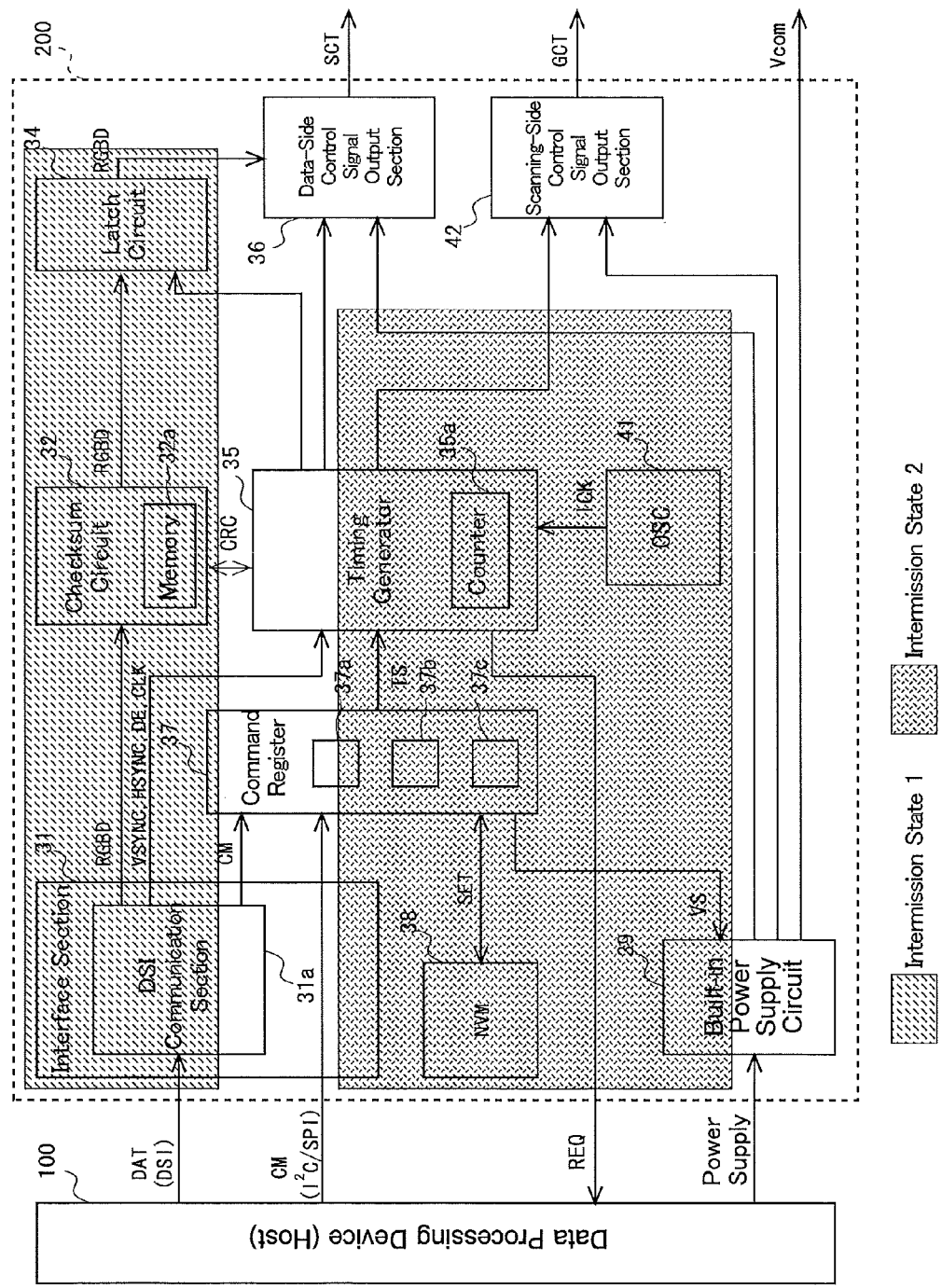
FIG. 9 is a block diagram for describing power saving in a display device connected with the data processing device according to the first embodiment.

Next, driver status information represented by LCD driving information is obtained from the display device 11 (Step S56) by using commands based on MIPI-DSI Standards. The LCD driving information contains not only counter information such as the non-refreshing count, but also information for restarting various circuits (specific circuits called "driver engine") within the display control circuit 200 which is to be stopped in the next Step S58 (see Step S66). After the LCD driving information is obtained, predetermined various circuits in the display control circuit 200 of the display device 11 are stopped by using commands based on MIPI-DSI Standards, etc., and instructions are sent to the display device 11 (Step S58) to turn OFF logic power sources and analog power sources used by these circuits. Circuits which are stopped in the display control circuit 200 in Intermission State 1 are those hatched with slanted dot lines drawn in one direction in FIG. 9. In Intermission State 2, other circuits hatched with slanted dot lines drawn in two directions in FIG. 9 are also stopped. It should be noted here that the circuits which are stopped in Intermission State 1 are configured to automatically stop (assume a power-save state) upon stopping video signal output from the host (Step S45). Those circuits which are stopped only in Intermission State 2 are configured to stop upon issuance of commands from the host (Step S58). In the present embodiment, the data-side control signal output section 36 and the scanning-side control signal output section 42 do not stop in any of Intermission State 1 and 2; however, they may be configured to come into stoppage in Intermission State 1, for example.

Thereafter, the DSI controller 135 assumes a sleep state (Step S60). Specifically, under the process management by the OS 130, the CPU 101 executes system function for bringing the process which is working as the DSI controller 135 into the sleep state. The process which is in the sleep state and therefore is a non-operating process resumes its operation once the time ((RERF_F−2)*16) ms which was set in Step S54 has elapsed and the refreshing preparation timer times out.

Once the refreshing preparation timer times out, corrections are performed to logic information related to those circuits in the display control circuit 200 which were stopped in Intermission State 2 (Step S62). In the present embodiment, corrections are made to the non-refreshing count and the polarity imbalance count which were obtained in Step S56, based on the refreshing start preceding frame count REF_F (length of the period of Intermission State) so as to compensate for the circuit stoppage.

Next, power supply is resumed to each of the circuits which were stopped in the display control circuit 200, and instructions for starting these stopped circuits are sent to the display device 11 (Step S64) using commands based on MIPI-DSI Standards.

Next, using commands which are based on MIPI-DSI Standards, LCD driving information which contains logic information after the correction is sent to the display device 11 (Step S66) so that this LCD driving information is re-set the display control circuit 200 of the display device 11.

Thereafter, the CPU proceeds to Step S52 to enter Intermission State 1, where the DSI controller 135 assumes the sleep state. When the CPU wakes up from the sleep state in Step S52, the CPU proceeds to Step S35 in FIG. 7. This brings the system back to Normal State upon the timeout of the refreshing start timer.

In Step S35, the CPU causes the DSI section 106 to resume its operation for transferring display image data to the display device 11 (Start video signal output). Thereafter, the CPU proceeds to Step S34 to cause the DSI section 106 to transfer display image data stored in the frame buffer 12*f* to the display device 11, and then the CPU returns to Step S32.

<1.6 Basic Operation>

Next, a basic operation of the above-described present embodiment will be described with reference to FIG. 10. Hereinafter, description will focus, among other operations performed in the data processing device 100 as the host, on data exchange with the display device 11, with an understanding that the operation state ("Normal State", "Intermission State 1", or "Intermission State 2") of the DSI controller 135 described above is the state of the CPU 101 or the host, and also the state of the display device 11 (referred to as "LCD" in FIG. 10 and thereafter). Further, in relation to the arrangement that the DSI controller 135 in the host assumes a sleep state in Intermission State 1 and Intermission State 2 (Steps S52 and S60), the state of DSI controller 135, sleep or awake, will be regarded as the state of the host, sleep or awake, where convenient in the following description since the present invention is uniquely characterized by control of a display device.

Figure 10:
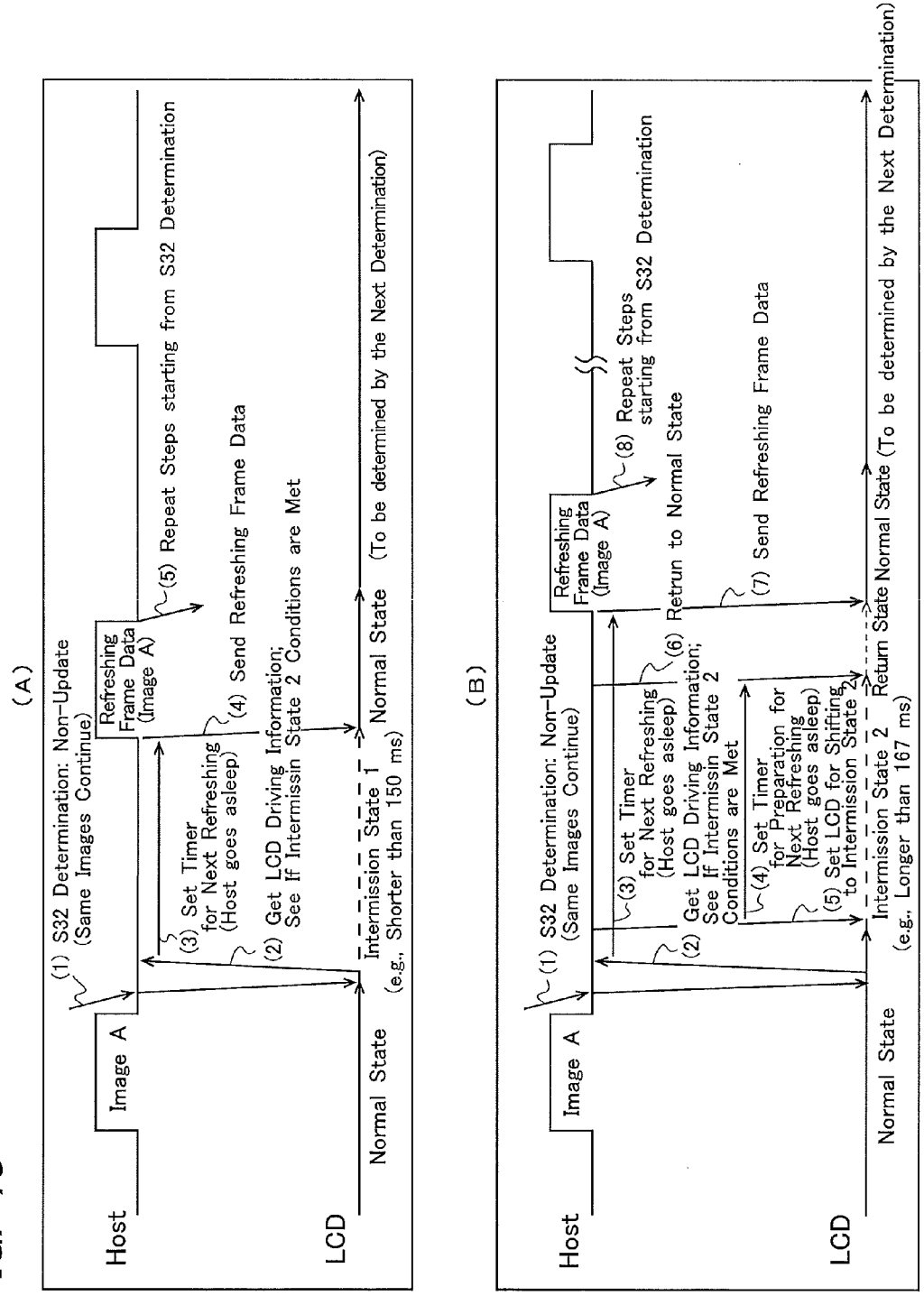
FIG. 10 consists of a sequence diagram (A) for describing an operation in the first embodiment when the host assumes Intermission State 1, and a sequence diagram (B) for describing an operation when the host assumes Intermission State 2.

(A) of FIG. 10 is a sequence diagram for describing an operation when the host shifts to Intermission State 1 in the present embodiment. With reference to (A) of FIG. 10, when there is a determination, in Normal State, that a transfer of data which represents Image A from the host to the LCD has not been followed by any data update in the frame buffer 12*f* for a predetermined amount of time (Step S32; (1) in (A) of FIG. 10), the host obtains LCD driving information from the LCD, and calculates the refreshing start preceding frame count REF_F based on a non-refreshing count contained in the LCD driving information (Step S36).

If the refreshing start preceding frame count REF_F is greater than "1", video signal output from the DSI section 106 is stopped (Step S38 and S45), and a determination is made based on this refreshing start preceding frame count REF_F as to whether or not conditions for shifting to Intermission State 2 are met (Step S48; (2) in (A) of FIG. 10). In the current example, the time for starting the next refreshing is not longer than 150 ms (the refreshing start preceding frame count REF_F is not greater than 10); therefore, the refreshing start timer is set so as to time out upon elapse of a time equivalent to the refreshing start preceding frame count REF_F and thereafter, the host and the LCD shift from Normal State to Intermission State 1 (Step S52; (3) in (A) of FIG. 10).

Thereafter, when the refreshing start timer times out, video signal output by the DSI section 106 is resumed (Step S35), and in order to refresh the display image in the LCD, refreshing frame data (data representing the display image A) is transferred from the host to the LCD (Step S34; (4) in (A) of FIG. 10). Thereafter, the CPU returns to Step S32, to repeat the routine of steps thereafter ((5) in (A) of FIG. 10).

As described above, if the LCD displays an Image A as a still image (if the image to be displayed is not changed), and the refreshing start preceding frame count REF_F which is calculated from LCD driving information obtained from the LCD is not greater than "10", the data representing the Image A is transferred as refreshing frame data to the LCD for each length of time equal to the refreshing start preceding frame count REF_F; and in those periods in which the transfer is not made, the DSI controller 135 in the video driver 131 of the host assumes the sleep state, namely, the host and the LCD assume Intermission State 1.

(B) of FIG. 10 is a sequence diagram for describing an operation when the host shifts to Intermission State 2 in the present embodiment. As shown in (B) of FIG. 10, after the host transfers data which represents an Image A to the LCD in Normal State, similar steps as in (A) of FIG. 10 are followed to stop video signal output from the DSI section 106 (Steps S32, S36, S38, S45; (1) in (B) of FIG. 10); and a determination is made as to whether or not conditions for shifting to Intermission State 2 are met, based on LCD driving information obtained from the LCD (Step S48; (2) in (B) of FIG. 10).

In this example shown in (B) of FIG. 10, the time before starting the next refreshing is not shorter than 167 ms (the refreshing start preceding frame count REF_F is greater than "10"); therefore, the refreshing start timer is set so as to time out upon elapse of a time equivalent to the refreshing start preceding frame count REF_F (Step S46; (3) in (B) of FIG. 10), and thereafter, the host and the LCD shift from Normal State to Intermission State 2 (Steps S54 through S60). In the above, a setting is made to the refreshing preparation timer for a time out upon elapse of a length of time which is equivalent to a slightly smaller number of frames than the refreshing start preceding frame count REF_F (in the present embodiment, the number of frames smaller by "2"), and instructions are sent to the LCD for bringing the LCD into Intermission State 2 by stopping predetermined circuits in the LCD and turning off predetermined power sources (Steps S54 and S58; (4) and (5) in (B) of FIG. 10).

Thereafter, when the refreshing preparation timer times out, information necessary for the next refreshing of the display image in the LCD, i.e., information and instructions for bringing the LCD back into Normal State, are sent to the LCD (Steps S62 through S66; (6) in (B) of FIG. 10).

Further thereafter, when the refreshing start timer times out, video signal output by the DSI section 106 is resumed (Step S35), and in order to refresh the display image in the LCD, refreshing frame data (data representing the display image A) is transferred from the host to the LCD (Step S34; (7) in (B) of FIG. 10). Thereafter, the CPU returns to Step S32, to repeat the routine of the steps thereafter ((8) in (B) of FIG. 10).

As has been described above, if the LCD displays an Image A as a still image and if the refreshing start preceding frame count REF_F calculated from LCD driving information obtained from the LCD is greater than "10", the LCD is brought into Intermission State 2 and the predetermined circuits in the LCD are stopped or their power supply is turned off until the next refreshing of the display image in the LCD, for further reduction in power consumption in the LCD (see FIG. 9). In this case, however, a preparation period is necessary for the next refreshing of display image in the LCD, so resumption from Intermission State 2 to Normal State before starting the next refreshing takes a resumption state in between (see (B) of FIG. 10).

<1.7 Operation Example>

Figure 11:
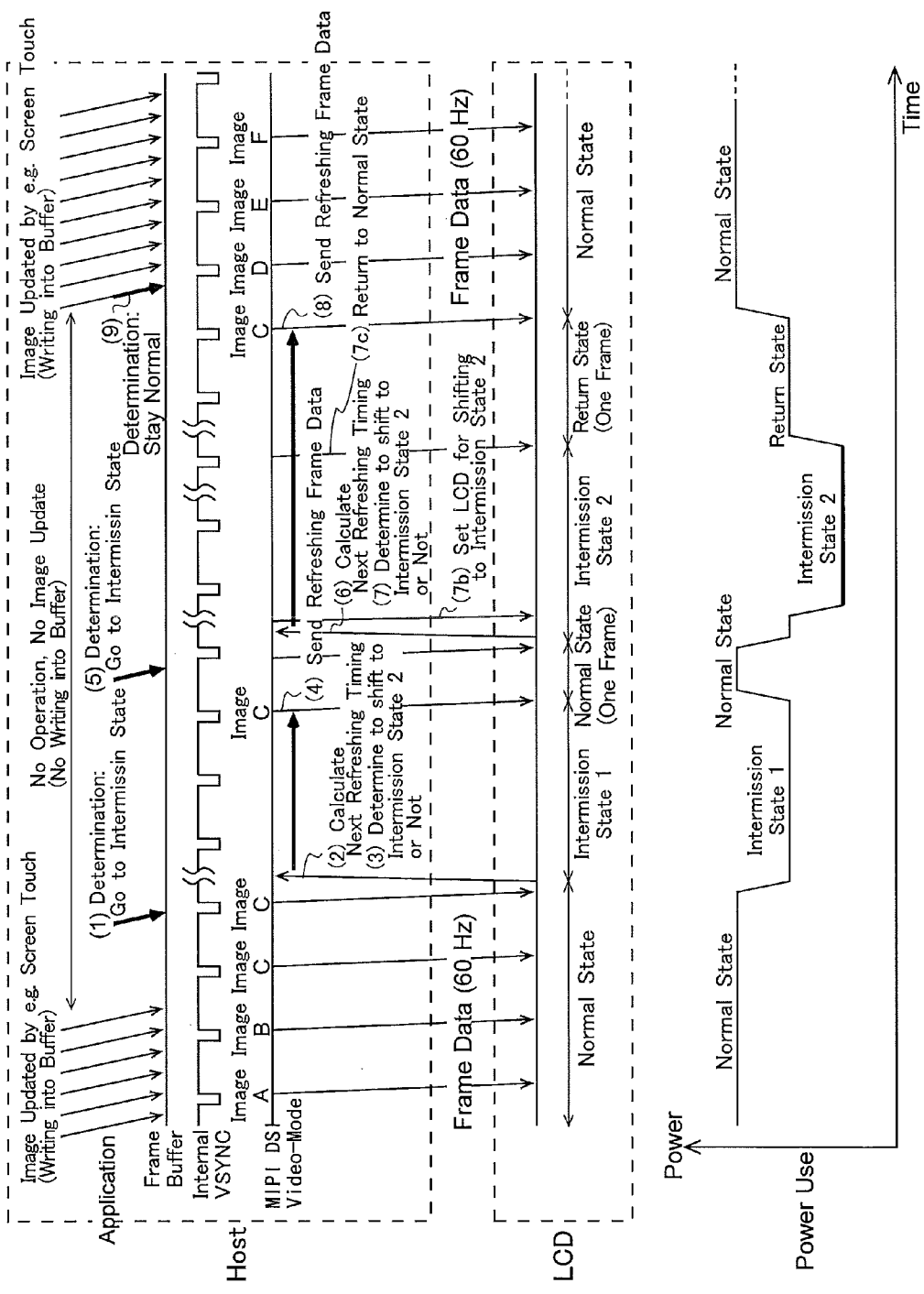
FIG. 11 is a sequence diagram and timing chart which shows an operation example according to the first embodiment.

FIG. 11 is a sequence diagram and timing chart which shows an operation example according to the present embodiment. Hereinafter, the present operation example will be described with reference to FIG. 11, together with FIG. 7 and FIG. 8, etc.

As shown in FIG. 11, in Normal State, if a user makes an operation on the operation input section 16 (such as touch panel) of a portable terminal (FIG. 1) which includes a data processing device according to the present embodiment, and causes an update of display image data in the frame buffer 12f, the update triggers new sets of display image data representing Images A, B and C respectively to be transferred sequentially, one at a frame period, to the LCD via an interface conforming to MIPI-DSI Standards.

Thereafter, when there is no more user operation made to the operation input section 16 and therefore there is no more updates made to the display image data in the frame buffer 12f, then shifting to Intermission State (Intermission State 1 or 2) is determined; whereupon LCD driving information is obtained from the LCD, and the refreshing start preceding frame count REF_F is calculated from the LCD driving information (more specifically, from a non-refreshing count, etc. contained in the information) (Steps S32 and S36; (1) and (2) in FIG. 11). Thereafter, video signal output from the DSI section 106 is stopped, and the refreshing start timer is set so as to time out upon elapse of a time equivalent to the refreshing start preceding frame count REF_F (Steps S45 and S46)

Next, based on the refreshing start preceding frame count REF_F, determination is made as to whether or not conditions are met for shifting to Intermission State 2 (Step S48; (3) in FIG. 11). In this example, it is determined that the conditions are not met, so the host and the LCD shift to Intermission State 1 (Step S52).

Thereafter, when the refreshing start timer times out, video signal output by the DSI section 106 is resumed; the host and the LCD return to Normal State; and in order to refresh the display image in the LCD, refreshing frame data (data representing the display image C) is sent from the host to the LCD (Steps S35 and S34; (4) in FIG. 11).

Thereafter, it is determined again whether or not the image data in the frame buffer 12f is updated; but at this point again, there is no user operation made into the operation input section 16, so it is determined to shift to Intermission State (Intermission State 1 or 2), and the refreshing start preceding frame count REF_F is calculated from the LCD driving information obtained from the LCD (Steps S32 and S36; (5) and (6) in FIG. 11). Thereafter, video signal output from the DSI section 106 is stopped, and the refreshing start timer is set so as to time out upon elapse of a time equivalent to the refreshing start preceding frame count REF_F (Steps S45 and S46)

Next, based on the refreshing start preceding frame count REF_F, determination is made as to whether or not conditions are met for shifting to Intermission State 2 (Step S48;

(7) in FIG. 11). In this example, it is determined that the conditions are met, so the host and the LCD shift to Intermission State 2 (Steps S54 through S60). At this point, the refreshing start timer is set, the earlier-described refreshing preparation timer is set, and instructions for bringing the LCD into Intermission State 2 are sent to the LCD (Steps S54 and S58; (7b) in FIG. 11).

Thereafter, when the refreshing preparation timer times out, information necessary for the next refreshing of the display image in the LCD (information and instructions for bringing the LCD back into Normal State) are sent to the LCD (Steps S62 through S66; (7c) in FIG. 11).

Further thereafter, when the refreshing start timer times out, video signal output by the DSI section 106 is resumed; the host and the LCD return to Normal State; and in order to refresh the display image in the LCD, refreshing frame data (data representing the display image C) is transferred from the host to the LCD (Steps S35 and S34; (8) in FIG. 11).

In the present operation example, when this transfer of the refreshing frame data is coming to its end, the user begins to make operation on the operation input section 16, and so it is determined that the display image data in the frame buffer 12f is updated (Step S32; (9) in FIG. 11). As a result, the update triggers, new sets of display image data, i.e., data representing Images D, E and F, . . . to be transferred sequentially, one at a frame period, to the LCD (Steps S32 and S34).

<1.8 Advantages>

Figure 17:
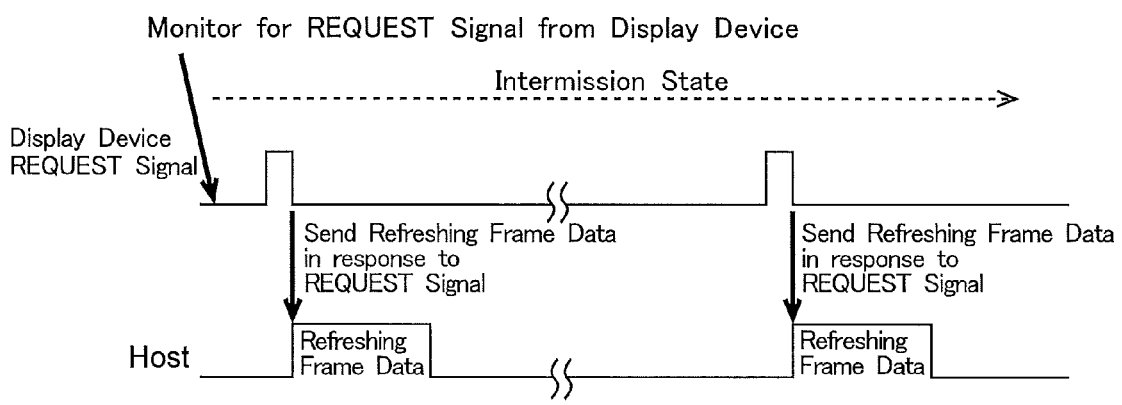
FIG. 17 is a sequence diagram for describing an operation of the host in an intermission state in the first conventional example.

According to the present embodiment described above, if the display device 11 (LCD) which is connected with the data processing device 100 (host) is operating in an intermission driving mode, the next refreshing timing is determined based on the refreshing start preceding frame count REF_F which is calculated from LCD driving information such as a non-refreshing count, obtained from the LCD, and the host (DSI controller 135 thereof) assumes a sleep state until the next refreshing (Steps S32, S36, S46 and S52; see FIG. 10, etc.) Therefore, unlike the conventional control (FIG. 17), there no longer is a need for the host to monitor for the REQUEST signal (a signal requesting a transfer of image data for refreshing) from the LCD. On the other hand, since the refreshing start preceding frame count REF_F is calculated from LCD driving information obtained from the LCD, it is possible to perform display image refreshing according to the needs of the LCD at an appropriate timing by taking characteristics of the LCD and driving state thereof into account. Therefore, it is possible to decrease power consumption not only in the LCD but also in the host while ensuring high display quality in the LCD in the intermission driving mode. It should be noted here that the update detection section 132 as an interrupt handler is started every frame period regardless of whether or not the DSI controller 135 in the video driver 131 is in a sleep state or not; however, the time necessary for this procedure is so short that the operation of the update detection section 132 poses no problem in view of power consumption in the host.

Also, according to the present embodiment, the host determines whether or not to shift to Intermission State, i.e., whether or not the image to be displayed is changed or not, based on data update monitoring at the frame buffer 12f (see FIG. 2, FIG. 6 and FIG. 7); this eliminates the need for the LCD to detect for image changes. Hence, the present embodiment also contributes to decrease in power consumption in the LCD.

Figure 18:
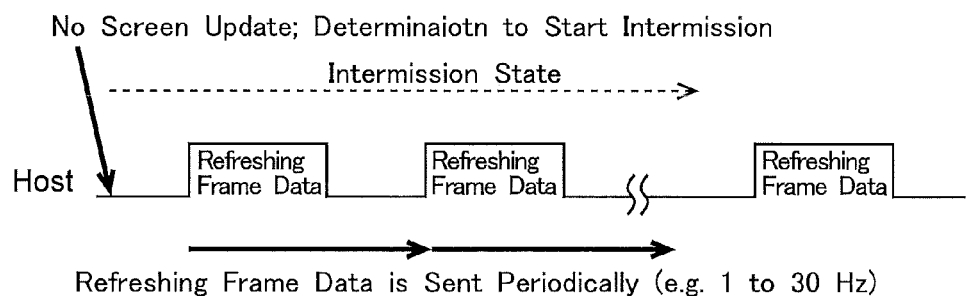
FIG. 18 is a sequence diagram for describing an operation of the host in an intermission state in the second conventional example.

Further, in the present embodiment, each time a shift is made to the Intermission State, the next refreshing start timing of the display image is determined based on LCD driving information from the LCD. This makes it possible to significantly reduce power consumption at the host even in comparison with the conventional example (FIG. 18) in which data for refreshing is sent from the host to the LCD at a predetermined time interval if there is no update in display image.

According to the present embodiment, Intermission State of the LCD consists of two levels, i.e., Intermission State 1 and Intermission State 2. If the refreshing start preceding frame count REF_F which is calculated from LCD driving information is not greater than a predetermined value ("10" in the present embodiment), Intermission State 1 is selected (Step S52) which allows for quick return to Normal State when there is any change found in the image to be displayed and the changed image must be displayed in the LCD: If the refreshing start preceding frame count REF_F is greater than the predetermined value, it is assumed that there will be a lower probability for bringing the sleeping LCD back to Normal State, and the LCD is shifted to Intermission State 2 (Step S48, S54 through S60; see (B) of FIG. 10), where the LCD's power consumption is decreased by a greater amount than in Intermission State 1. This offers a greater power saving advantage for those display devices which are capable of extending their refreshing interval when display image is not updated. It should be noted here that while the present embodiment and the other embodiment which will be described later make use of a two-level Intermission State consisting of Intermission State 1 and Intermission State 2, Intermission State may consists of three or more levels.

Figure 12:
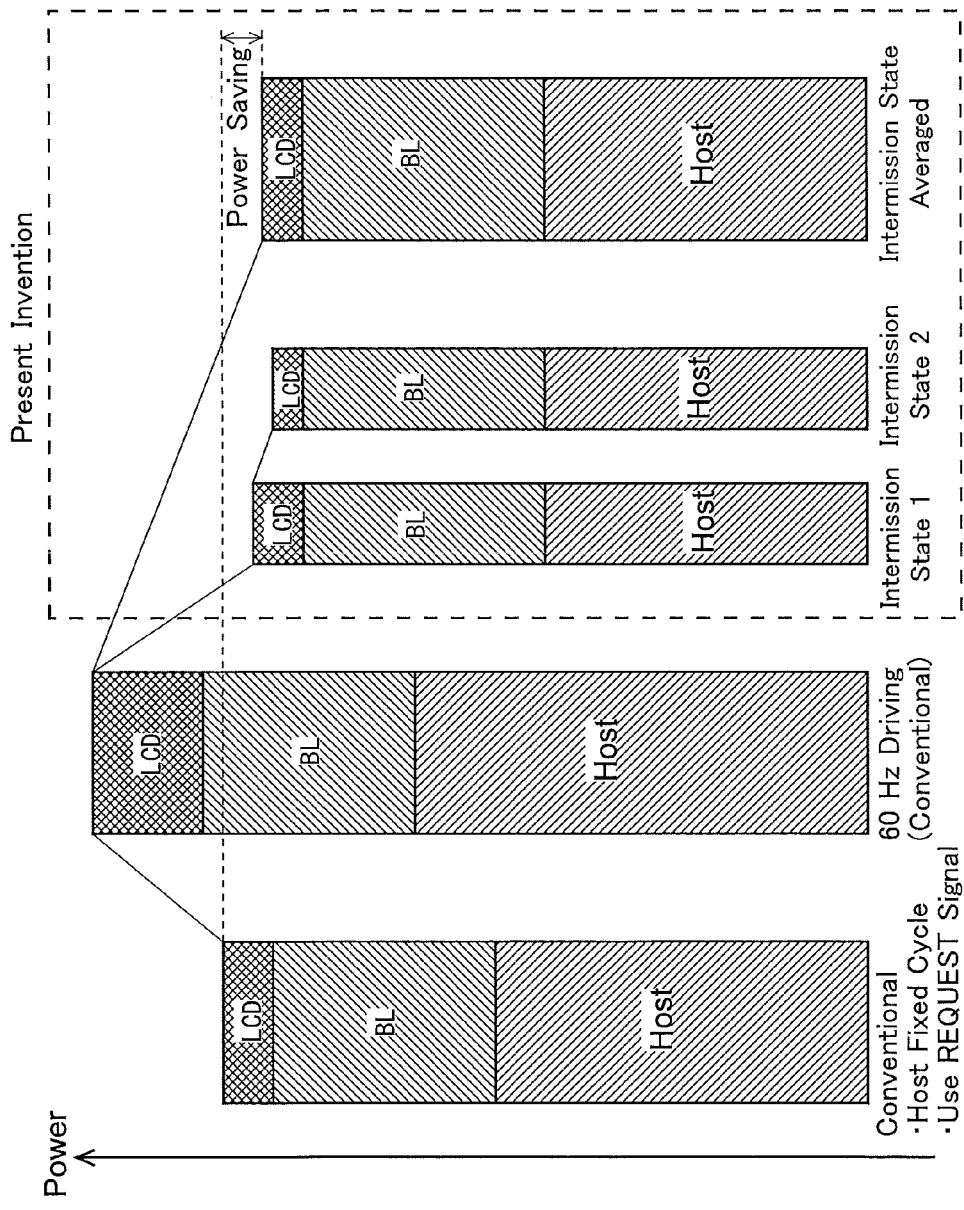
FIG. 12 is a diagram which shows power saving performance according to the first embodiment.

FIG. 12 is a diagram which shows power saving performance according to the present embodiment described above. In FIG. 12, columns labeled with "LCD", "BL" and "Host" represent amounts of power consumption respectively by the LCD (display device 11), the backlight unit 50 and the host (data processing device 100). As understood from FIG. 12, according to the present embodiment, power consumption by the entire electronic appliance (portable terminal) is significantly decreased as compared to a case when operating at a 60 Hz refreshing rate (hereinafter called "60 Hz drive"), and also is decreased when compared to the first conventional example (REQUEST signal) shown in FIG. 17 and the second conventional example (host fixed cycle) shown in FIG. 18. More specifically, power saving by the host in the present embodiment is greater than any of the 60H drive, the first conventional example and the second conventional example. Also, the LCD's power consumption in Intermission State 1 of the present embodiment is approximately the same as power consumption by the first and the second conventional, but the LCD's power consumption in Intermission State 2 of the present embodiment is smaller than any of the first and the second conventional examples.

<2. Second Embodiment>

Next, description will cover a data processing device according to a second embodiment of the present invention. Like the first embodiment, this data processing device is also used in a portable terminal configured as shown in FIG. 1. The data processing device according to the present embodiment which is connected with a display device has primarily the same system configuration (hardware and software configurations) as in the first embodiment (FIG. 2); however, there are a few differences (which will be described later). The display device and its display control circuit are identical with those in the first embodiment (FIG. 3 and FIG. 5). Therefore, among these hardware and software components of the present embodiment, those which are identical with or corresponding to the components in the first embodiment will be indicated with the same reference symbols, without repeating detailed descriptions thereof.

Figure 13:
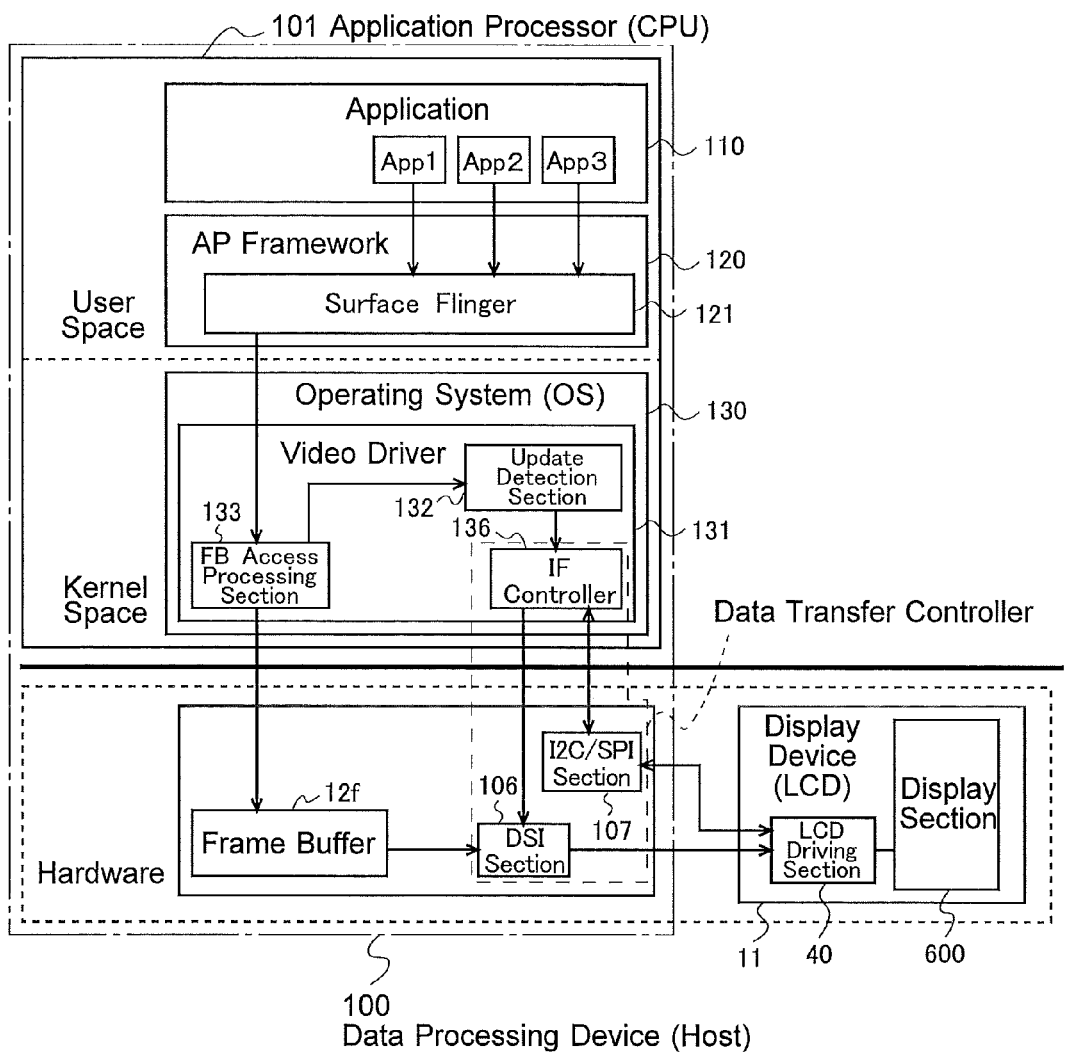
FIG. 13 is a block diagram which shows a system configuration of a data processing device according to a second embodiment of the present invention, with a display device connected therewith.
Figure 16:
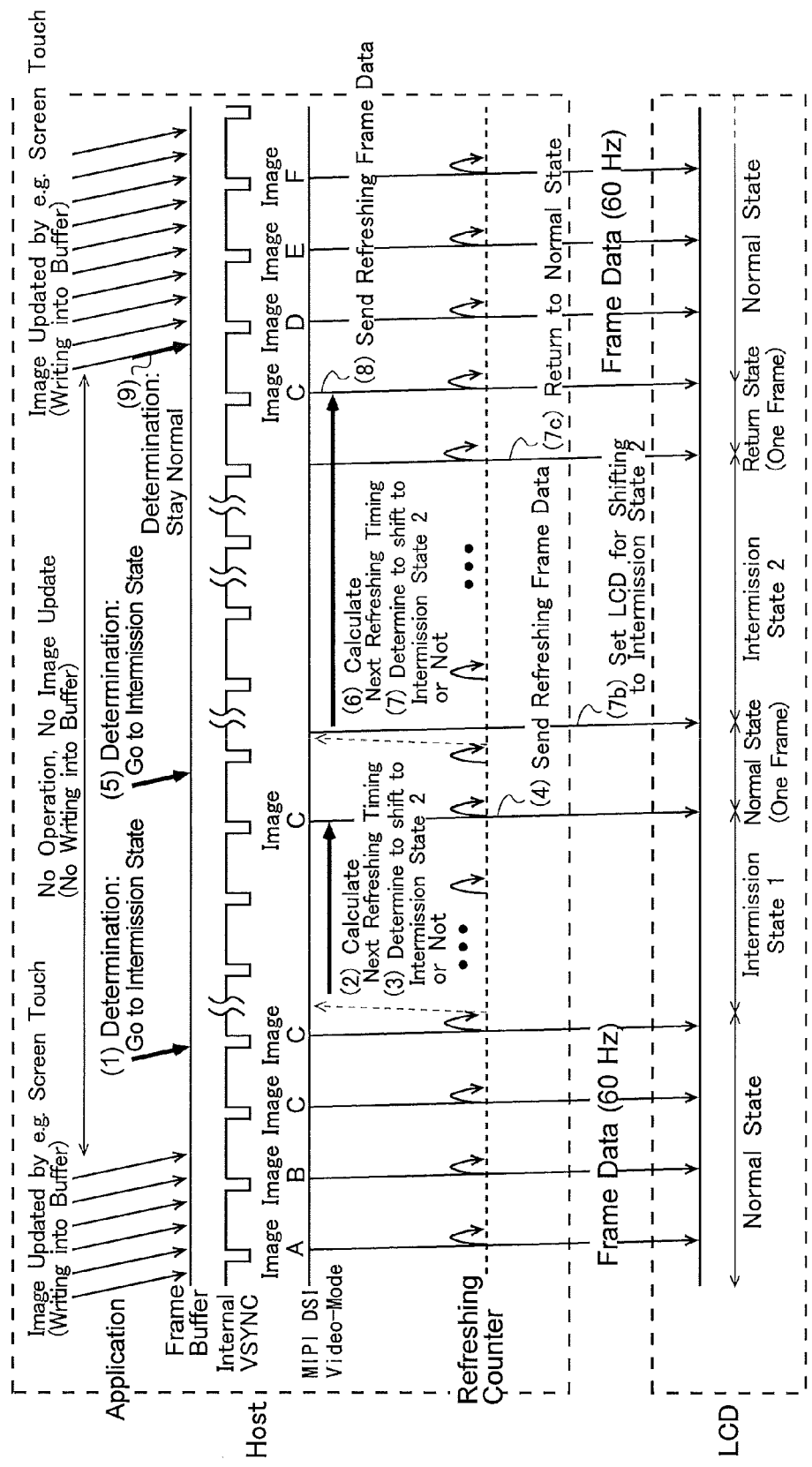
FIG. 16 is a sequence diagram which shows an operation example according to the third embodiment.

FIG. 13 is a block diagram which shows a system configuration of a data processing device 100 according to the present embodiment, connected with a display device 11. Whereas the first embodiment makes use of commands and interface which conform to MIPI-DSI Standards (hereinafter called "DSI interface") to give instructions to the display device 11 (LCD), to transfer setting information, and to obtain driving information, etc. from the LCD in the first embodiment, the present embodiment makes use of an interface which conforms to I2C Standards or SPI Standards (hereinafter called "I2C/SPI interface") in these transfer operation and information acquisition. Therefore, as shown in FIG. 16, the data processing device 100 includes an I2C/SPI section 107 provided by an I2C/SPI interface as a host-side interface circuit, in addition to the DSI section 106 provided by a DSI interface. Accordingly, the DSI controller 135 which serves as an interface controller for the video driver 131 in the first embodiment is replaced by an IF controller 136 in the present embodiment. However, a processing procedure of a program for implementing the IF controller 136 is substantially the same, differing only in that the I2C/SPI interface is used in place of the DSI interface in obtaining LCD information from the display device 11 and giving instructions, etc. to the display device 11 (Step S36, S56, S58, S64 and S66) (see FIG. 7 and FIG. 8). For this reason, hereinafter, reference to such drawings as FIG. 7 and FIG. 8 will also be made in describing the present embodiment using FIG. 14 which corresponds to FIG. 11 that shows an operation example of the first embodiment. As a note for the present embodiment, the DSI section 106 and the I2C/SPI section 107 working as interface circuits constitute the data transfer controller, together with the IF controller 136 working as an interface controller.

Figure 14:
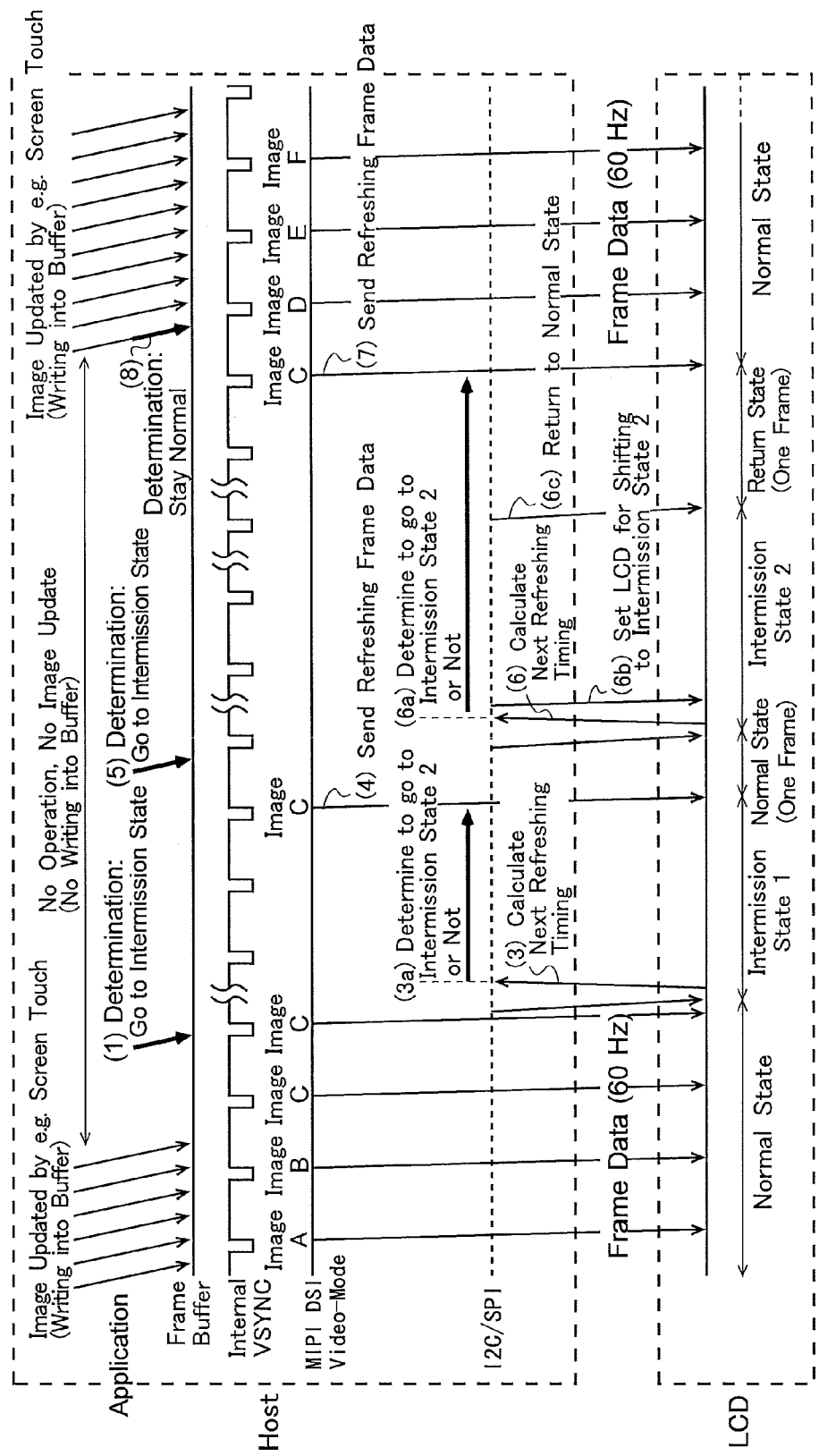
FIG. 14 is a sequence diagram which shows an operation example according to the second embodiment.

FIG. 14 is a sequence diagram which shows an operation example according to the present embodiment. In this operation example, like the operation example in the first embodiment shown in FIG. 11, when there is no user operation made into the operation input section 16 (e.g., touch panel), and therefore there is no more updates made to the display image data in the frame buffer 12f, then shifting to Intermission State (Intermission State 1 or 2) is determined; whereupon LCD driving information is obtained from the LCD, and the refreshing start preceding frame count REF_F is calculated from the LCD driving information (more specifically, from a non-refreshing count, etc. contained in the information) (Steps S32 and S36; (1) and (3) in FIG. 14). A difference however, is that LCD driving information which is obtained via a DSI interface in the first embodiment (see FIG. 11), is obtained via an I2C/SPI interface in the present embodiment (see FIG. 14 and FIG. 5). Thereafter, based on the refreshing start preceding frame count REF_F which is calculated from the obtained LCD driving information, determination is made as to whether or not conditions are met for shifting to Intermission State 2 (Step S48; (3a) in FIG. 14).

Thereafter, when there is no updates again made to the display image data in the frame buffer 12f and therefore shifting to Intermission State (Intermission State 1 or 2) is determined, then LCD driving information is obtained from the LCD not via the DSI interface but via the I2C/SPI interface (Steps S32 and S36; (5) and (6) in FIG. 14), and determination is made as to whether or not the conditions for shifting to Intermission State 2 are met, based on the refreshing start preceding frame count REF_F which is calculated from the said LCD driving information. In this example, it is determined that the conditions are met, so the host and the LCD shift into Intermission State 2 (Steps S54 through S60). At this point, the refreshing start timer is set, the refreshing preparation timer is set, and instructions for bringing the LCD into Intermission State 2 are sent to the LCD (Steps S54 and S58). In the present embodiment, the instructions are sent to the LCD not via the DSI interface but via the I2C/SPI interface ((6b) in FIG. 14).

Thereafter, when the refreshing preparation timer times out, information necessary for the next refreshing of the display image in the LCD (information and instructions for bringing the LCD back into Normal State) are sent to the LCD (Steps S62 through S66). In the present embodiment, the information and instructions are sent not via the DSI interface but via the I2C/SPI interface ((6c) in FIG. 14).

Other than the above-described differences, specifics in the present operation example are identical with those in the operation example of the first embodiment shown in FIG. 11. Therefore, transfer of display image data such as refreshing frame data to the LCD is performed via the DSI interface as shown in FIG. 14, in the present operation example.

As understood from the description made above, exchange of data (information and instructions) are made entirely via the DSI interface in the first embodiment, but in the present embodiment, transfer of instructions and setting information to the LCD, and obtainment of driving information from the LCD are made via the I2C/SPI interface (see (3), (6), (6b) and (6c) in FIG. 14). However, operations in the present embodiment are substantially the same as those in the first embodiment. Therefore, the present embodiment offers the same advantages as offered by the first embodiment. In the present embodiment, the second interface circuit is provided as a serial interface having a slower data transfer speed than the first interface circuit. This can offer an additional advantage of decreased power consumption in data transfer between the data processing device and the display device through selective use of the first interface circuit and the second interface circuit depending on the amount of data transfer.

<3. Third Embodiment>

Next, description will cover a data processing device according to a third embodiment of the present invention. Like the first embodiment, this data processing device is also used in a portable terminal configured as shown in FIG. 1. The data processing device and display device included in this portable terminal have the same system configuration (hardware and software configurations) as in the first embodiment (FIG. 2). Further, the display device and its display control circuit have basically the same configurations as in the first embodiment (FIG. 3 and FIG. 5). Therefore, among these hardware and software components of the present embodiment, those which are identical with or corresponding to the components in the first embodiment will be indicated with the same reference symbols, without repeating detailed descriptions thereof.

In the first embodiment, the LCD's display control circuit 200 includes the counter 35a which counts the number of frames having an image which has no change, i.e., the number of frames of a still image, as the non-refreshing frame count (see FIG. 5) in order to obtain refreshing timing of a display image in the display device 11 (LCD). In the present embodiment, the function of the counter 35a, i.e., the function as a counter to count the non-refreshing frame count (hereinafter called "refreshing counter") is provided by the data processing device 100 working as the host. This refreshing counter is implemented by software, within the host as will be described later. It should be noted here that the refreshing counter gives the earlier-described non-refreshing count, and the value is reset to "0" when the display image is refreshed in the LCD.

Figure 15:
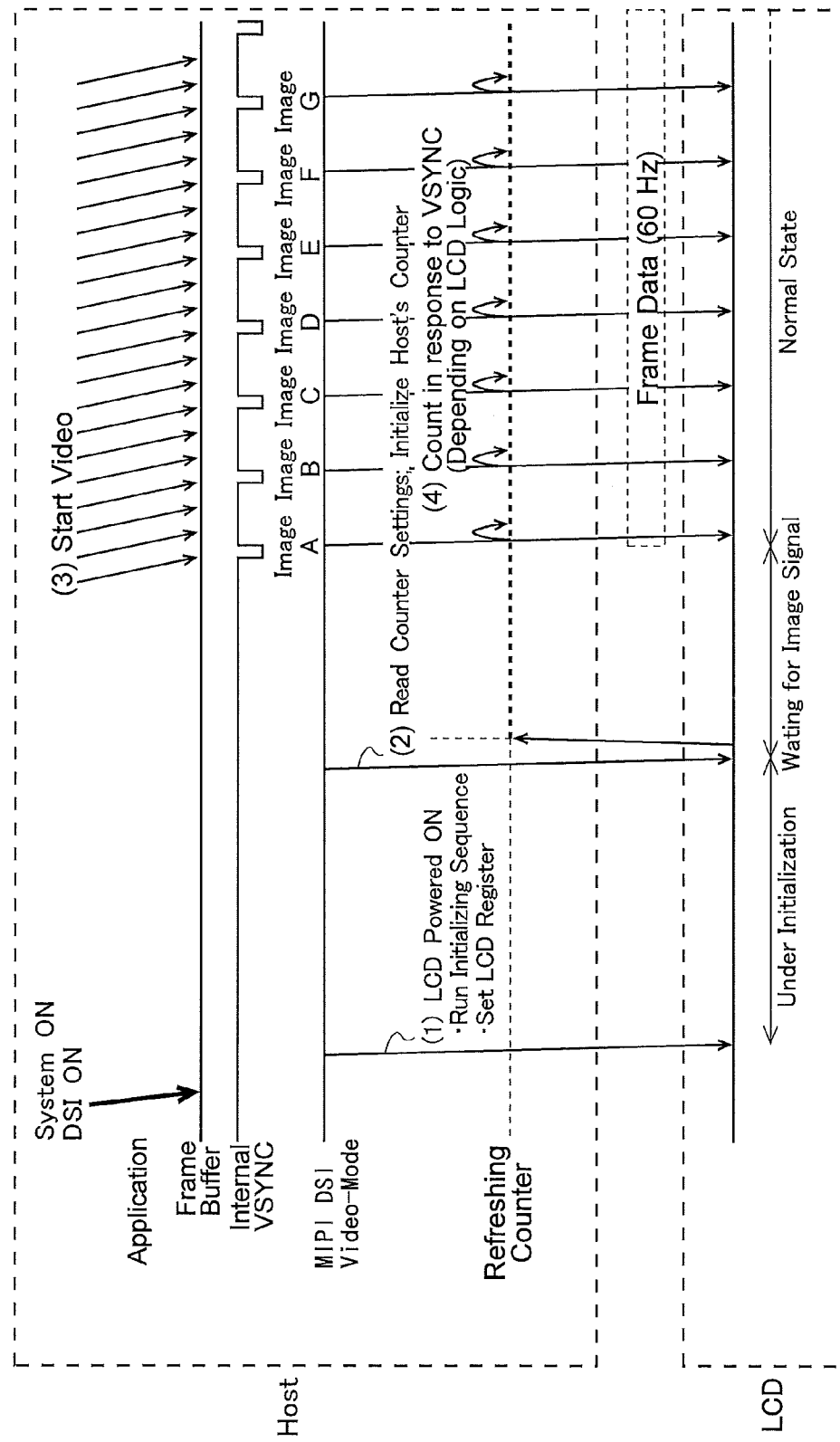
FIG. 15 is a sequence diagram for describing an operation right after an initialization sequence according to a third embodiment of the present invention.

FIG. 15 is a drawing for describing an operation immediately after an initialization sequence of the host and the LCD when electric power is turned on in the present embodiment. Operation of the refreshing counter is different depending on the LCD. Therefore, in the present embodiment, counter setting parameters which specify the operation of the refreshing counter to match the display device 11 (LCD) connected with the data processing device 100 working as the host are obtained from the display device 11 (LCD) right after the initialization sequence following the power ON ((1) and (2) in FIG. 15). Since the refreshing counter is utilized to determine the timing for the next refreshing of the displayed image, the counter setting parameters can be regarded as refreshing-related information.

The counter setting parameters are thus obtained and then, if a user makes an operation on the operation input section 16 (such as touch panel), whereby the display image data in the frame buffer 12$f$ is updated, the host and the LCD assume Normal State, and the video driver 131 which includes the DSI controller 135 and the update detection section 132 operates basically as shown in the flow charts in FIG. 6 through FIG. 8. Therefore, if a user makes an operation on the operation input section 16 in the Normal State whereby the display image data in the frame buffer 12$f$ is updated, the update causes, as shown in FIG. 15, new sets of display image data, representing Images A, B, C . . . respectively to be transferred sequentially, one at a frame period, to the LCD via the DSI interface.

Also, the non-refreshing count is updated or reset based on the counter setting parameters at the DSI controller 135 or the update detection section 132 in the video driver 131. If the host shifts to Intermission State, the non-refreshing count is corrected when returning from Intermission State to Normal State (Step S62). As has been described, the refreshing counter is implemented by software in the video driver 131 of the host. Therefore, the present embodiment does not require Steps S36 and S56 in the operation of the DSI controller 135 for obtaining the non-refreshing count as LCD driving information.

Next, reference to such drawings as FIG. 7 and FIG. 8 will also be made in describing the present embodiment using FIG. 16 which corresponds to FIG. 11 that shows an operation example of the first embodiment.

FIG. 16 is a sequence diagram which shows an operation example according to the present embodiment. In this operation example, like the operation example in the first embodiment shown in FIG. 11, when there is no user operation made into the operation input section 16 and there is no more updates made to the display image data in the frame buffer 12$f$, then shifting to Intermission State (Intermission State 1 or 2) is determined (Steps S32 and S38; (1) in FIG. 16). Now, in the first embodiment, the refreshing start preceding frame count REF_F is calculated from the non-refreshing count, etc. contained in the LCD driving information which is obtained from the LCD (Step S36); in the present embodiment, however, the refreshing start preceding frame count REF_F is calculated from a value, i.e., a non-refreshing count, supplied by the refreshing counter which is implemented by software ((2) in FIG. 16). Thereafter, based on the refreshing start preceding frame count REF_F, determination is made as to whether or not conditions are met for shifting to Intermission State 2 (Step S48; (3) in FIG. 16).

Thereafter, when there is no updates again made to the display image data in the frame buffer 12$f$ and therefore shifting to Intermission State (Intermission State 1 or 2) is determined, then LCD driving information including the non-refreshing count is not obtained from the LCD but the refreshing start preceding frame count REF_F is calculated ((6) in FIG. 16) from the non-refreshing count which is a value from the refreshing counter inside the host, and determination is made as to whether or not the conditions for shifting to Intermission State 2 are met, based on this refreshing start preceding frame count REF_F. In this example, it is determined that the conditions are met, so the host and the LCD shift into Intermission State 2 (Steps S54 through S60). At this point, the refreshing start timer is set, the refreshing preparation timer is set, and instructions for bringing the LCD into Intermission State 2 are sent to the LCD (Steps S54 and S58; (7$b$) in FIG. 16).

Thereafter, when the refreshing preparation timer times out, information necessary for the next refreshing of the display image in the LCD (information and instructions for bring the LCD back into Normal State) are sent to the LCD (Steps S62 through S66; (7$c$) in FIG. 14).

Other than the above-described differences, specifics in the present operation example are substantially the same as those in the operation example of the first embodiment shown in FIG. 11.

According to the present embodiment described above, since the host has a function of the refreshing counter, it is possible to obtain the timing of the next refreshing of the display image in the LCD at the host as shown in FIG. 16, without obtaining LCD driving information such as the non-refreshing count (the number of frames in the non-refreshing period). This eliminates the need for information exchange between the host and the LCD regarding the refreshing timing and makes refreshing control of the LCD simpler while offering the same power saving advantages as offered by the first embodiment.

Also, according to the present embodiment, counter setting parameters which specify an operation of the refreshing counter to match the LCD connected with the host are obtained by the host in an initialization sequence. This makes it possible to refresh the display image in a manner suitable for characteristics and driving state of the LCD while allowing the host to centrally manage the display image refreshing in the LCD.

In the present embodiment, the function of the refreshing counter is implemented in the host by means of software. In addition to this, there may be an arrangement in which the function of the polarity imbalance counter is also implemented in the host by means of software. This makes it possible to determine the next refreshing timing of the display image while taking the polarity imbalance count into consideration, in addition to the non-refreshing count.

<4. Variations>

The present invention is not limited to any of the embodiments described above, but may be varied in many ways within the scope of the present invention. The present invention also includes any combinations of a plurality of the embodiments described thus far, as far as there is no conflict arising from the combination.

For example, in each of the above-described embodiments, refreshing timing of the display image is managed by means of time (ms) equivalent to the refreshing start preceding frame count REF_F (Steps S36 and S46) in the host (at the DSI controller 135 thereof): Instead of this, however, the number of frames may be used in the management. As another example, in the first and the third embodiments, the refreshing start preceding frame count REF_F used in the management of display image refreshing timing is calculated when it is found that the display image data in the frame buffer 12f is not updated and the calculation is based on the LCD driving information obtained from the LCD. Instead of this, however, there may be an arrangement that the number of frames, for example, in the non-refreshing period is counted from immediately after the host is started as part of management of the display image refreshing timing. As still another example, in an arrangement where values for determining the display image refreshing timing (e.g., the number of frames in the non-refreshing period, i.e., the non-refreshing count) is calculated by both of the host and the LCD, the two pieces of information may be checked against each other for mutual correction when the information is placed into the LCD for a transfer from Intermission State to Normal State (see Steps S62 and S66).

Means for managing the next refreshing timing of display image in the LCD based on monitoring presence/absence of display image data update in the frame buffer 12f is implemented in the host in each of the embodiments as shown in FIG. 2, as a component of the video driver 131 which operates in the kernel space. However, the present invention is not limited to this. For example, part of the means may be implemented as a component within the AP frame work.

<5. Others>

Although each embodiment has been described by using a portable terminal as an example (FIG. 1), the present invention is not limited to this, and is applicable to any data processing device used for an electronic appliance if a frame buffer is provided on the host side. Also, the display device to be connected with the data processing device according to the present invention may be any display device that performs intermission driving. In other words, the present invention is also applicable to electronic appliances which make use of display devices other than liquid crystal display devices (LCDs), such as an organic EL (Electro Luminescence) display device.

INDUSTRIAL APPLICABILITY

The present invention is applicable to data processing devices connected with display devices which perform so called intermission driving, and to method for controlling these display devices in these data processing devices.

DESCRIPTION OF REFERENCE CHARACTERS

10 Main Controller
11 Display Device (LCD, LCD Module)
12 Memory Section
12f Frame Buffer
16 Operation Input Section
31 Interface Section
31a DSI Communication Section
35 Timing Generator
35a Counter
37 Command Register
39 Built-in Power Supply Circuit
40 LCD Driving Section
60 Liquid Crystal Display Panel
100 Data Processing Device (Host)
101 Application Processor (CPU)
106 DSI Section (First Interface Circuit)
107 I2C/SPI Section (Second Interface Circuit)
120 Application Frame Work (AP Frame Work)
130 Operating System (OS)
131 Video Driver
132 Update Detection Section
133 FB Access Processing Section
135 DSI Controller (Interface Controller)
136 IF controller (Interface Controller)
200 Display Control Circuit
310 Data Signal Line Drive Circuit
320 Scanning Signal Line Drive Circuit
600 Display Section

The invention claimed is:

1. A data processing device connected data-exchangeably with a display device which drives a display section in such a manner that a refreshing period during which an image displayed in the display section is refreshed and a non-refreshing period during which an image displayed in the display section is not refreshed are alternated with each other, the data processing device comprising:
  a frame buffer configured to store image data representing an image to be displayed in the display section;
  an update detection section configured to detect an update of image data in the frame buffer;
  a data transfer controller configured to: transfer image data stored in the frame buffer to the display device when the update detection section detects an update of image data in the frame buffer; determine a next refreshing timing of the display image in the display section based on refreshing-related information obtained from the display device as information regarding refreshing timing determination of the display image in the display section and assume an intermission state for an intermission period corresponding to the next refreshing timing when the update detection section detects a non-update of the image data in the frame buffer for a predetermined period; and transfer image data stored in the frame buffer to the display device upon returning from the intermission state to a normal state.

2. The data processing device according to claim 1, wherein the data transfer controller returns to the normal state and transfers image data stored in the frame buffer to the display device when the update detection section detects an update of image data in the frame buffer while the data transfer controller is in the intermission state.

3. The data processing device according to claim 1, wherein the data transfer controller obtains the refreshing-related information from the display device and determines the next refreshing timing based on the obtained refreshing-related information when the update detection section detects a non-update of image data in the frame buffer for the predetermined period.

4. The data processing device according to claim 1, wherein the intermission state includes a first intermission state and a second intermission state in which power consumption is smaller than in the first intermission state;
  when the update detection section detects a non-update of image data in the frame buffer for the predetermined period, the data transfer controller
  transfers to the display device an instruction for stopping operation of a circuit which is within the display device but functionally replaceable by the data processing device and thereafter shifts from the normal state to the second intermission state, if the intermission period is longer than a predetermined reference period, but
  shifts from the normal state to the first intermission state without transferring the instruction to the display device if the intermission period is not longer than the reference period, and transfers to the display device information obtained by operation equivalent to operation to be made by the replaceable circuit and an instruction for resuming operation of the replaceable circuit when returning from the second intermission state to the normal state;

the data transfer controller returns to the normal state and transfers image data stored in the frame buffer to the display device when the update detection section detects an update of image data in the frame buffer while the data transfer controller is in the first intermission state.

5. The data processing device according to claim 4, wherein the data transfer controller transfers to the display device an instruction for turning off power supply which is adapted to power the circuit in the display device but unnecessary in the second intermission state and then shifts to the second intermission state, if the intermission period is longer than the reference period when the update detection section detects a non-update of image data in the frame buffer for the predetermined period.

6. The data processing device according to claim 1, wherein the data transfer controller includes:

a first interface circuit configured to transfer image data stored in the frame buffer to the display device, and a second interface circuit configured to obtain the refreshing-related information from the display device when the update detection section detects a non-update of image data in the frame buffer for the predetermined period, wherein the second interface circuit is provided as a serial interface having a slower data transfer speed than the first interface circuit.

7. The data processing device according to claim 1, wherein the data transfer controller obtains the refreshing-related information from the display device upon power application to the display device.

8. The data processing device according to claim 7, wherein the data transfer controller determines the next refreshing timing from a non-refreshing count which is obtained by counting frames in the non-refreshing period based on the refreshing-related information.

9. The data processing device according to claim 1, wherein the data processing device includes:

a processor, and a memory configured to store a program of an operating system which is capable of managing processes running on the processor, the program being stored as an OS program, wherein the OS program includes a device driver program for controlling the display device, the update detection section is implemented as part of the device driver by the processor executing the OS program, the data transfer controller includes:

an interface circuit configured to exchanges data with the display device and an interface controller that is implemented as a system process to control the display device via control of the interface circuit, by the processor executing the OS program;

the interface controller stops the interface circuit and then assumes a sleep state when the data transfer controller shifts to the intermission state, and returns from the sleep state to an active state and causes the interface circuit to transfer image data which is stored in the frame buffer to the display device when the data transfer controller returns from the intermission state to the normal state.

10. The data processing device according to claim 1, wherein the display section includes a thin film transistor having a channel etch structure which has a channel layer formed of an oxide semiconductor, as a switching element for forming each pixel constituting an image to be displayed.

11. The data processing device according to claim 10, wherein the oxide semiconductor is provided by In—Ga—Zn—O.

12. The data processing device according to claim 11, wherein the oxide semiconductor is provided by a crystalline In—Ga—Zn—O.

13. A method for enabling a data processing device to control a display device which is connected data-exchangeably therewith and drives a display section in such a manner that a refreshing period during which an image displayed in the display section is refreshed and a non-refreshing period during which an image displayed in the display section is not refreshed are alternated with each other, the method comprising:

an update detection step of detecting an update of image data in a frame buffer which is provided in the data processing device for storage of image data representing an image to be displayed in the display section;

an updated-data transfer step of transferring image data stored in the frame buffer to the display device upon detection of an update of image data in the frame buffer;

an intermission step of determining a next refreshing timing of the display image in the display section based on refreshing-related information obtained from the display device as information regarding refreshing timing determination of the display image in the display section, and assuming an intermission state for an intermission period corresponding to the next refreshing timing, upon detection of a non-update of image data in the frame buffer for the predetermined period; and a refreshing-data transfer step of transferring image data stored in the frame buffer upon returning from the intermission state to a normal state.

14. The method according to claim 13, wherein detection of an update of image data at the frame buffer in the update detection step during the intermission state triggers a return to the normal state and a transfer of image data stored in the frame buffer to the display device in the updated-data transfer step.

15. The method according to claim 13, wherein the refreshing-related information is obtained from the display device and the next refreshing timing is determined based on the obtained refreshing-related information, upon detection of a non-update of image data in the frame buffer for the predetermined period during the intermission state.

16. The method according to claim 13, further comprising an information obtaining step of obtaining the refreshing-related information from the display device upon power application to the display device.

17. A non-transitory computer-readable recording medium containing a device driver program for enabling a data processing device to control a display device which is connected data-exchangeably therewith and drives a display section in such a manner that a refreshing period during which an image displayed in the display section is refreshed and a non-refreshing period during which an image displayed in the display section is not refreshed are alternated with each other, the program causing a processor in the data processing device to execute:

an update detection step of detecting an update of image data in a frame buffer which is provided in the data processing device for storage of image data representing an image to be displayed in the display section;

an updated-data transfer step of transferring image data stored in the frame buffer to the display device upon detection of an update of image data in the frame buffer;

an intermission step of determining a next refreshing timing of the display image in the display section based on refreshing-related information obtained from the display device as information regarding refreshing timing determination of the display image in the display section, and assuming an intermission state for an intermission period corresponding to the next refreshing timing, upon detection of a non-update of image data in the frame buffer for the predetermined period; and a refreshing-data transfer step of transferring image data stored in the frame buffer upon returning from the intermission state to a normal State.

* * * * *